United States Patent
Ueno et al.

(10) Patent No.: US 12,122,947 B2
(45) Date of Patent: Oct. 22, 2024

(54) ADHESIVE SHEET

(71) Applicant: NITTO DENKO CORPORATION, Ibaraki (JP)

(72) Inventors: Shusaku Ueno, Ibaraki (JP); Takumi Yutou, Ibaraki (JP); Takamasa Hirayama, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 748 days.

(21) Appl. No.: 17/269,592

(22) PCT Filed: Aug. 19, 2019

(86) PCT No.: PCT/JP2019/032258
§ 371 (c)(1),
(2) Date: Feb. 19, 2021

(87) PCT Pub. No.: WO2020/049986
PCT Pub. Date: Mar. 12, 2020

(65) Prior Publication Data
US 2021/0309890 A1  Oct. 7, 2021

(30) Foreign Application Priority Data
Sep. 6, 2018 (JP) .................. 2018-166994

(51) Int. Cl.
| C09J 11/08 | (2006.01) |
| B24B 7/22 | (2006.01) |
| C09J 7/38 | (2018.01) |
| C09J 125/10 | (2006.01) |
| C09J 131/04 | (2006.01) |
| C09J 153/02 | (2006.01) |
| H01L 21/304 | (2006.01) |
| H01L 21/683 | (2006.01) |

(52) U.S. Cl.
CPC ............. *C09J 7/381* (2018.01); *B24B 7/228* (2013.01); *C09J 11/08* (2013.01); *C09J 125/10* (2013.01); *C09J 131/04* (2013.01); *C09J 153/02* (2013.01); *H01L 21/304* (2013.01); *H01L 21/6836* (2013.01); *C09J 2425/00* (2013.01); *C09J 2431/00* (2013.01); *H01L 2221/68327* (2013.01); *Y10T 428/2883* (2015.01)

(58) Field of Classification Search
None
See application file for complete search history.

(56) References Cited

U.S. PATENT DOCUMENTS

| 2008/0102241 A1* | 5/2008 | Yutou | .............. C09J 7/22 |
| | | | 428/343 |
| 2012/0156456 A1 | 6/2012 | Niimi et al. | |
| 2013/0157086 A1* | 6/2013 | Kawabe | .............. C09J 7/381 |
| | | | 156/60 |
| 2019/0329536 A1 | 10/2019 | Niimi et al. | |
| 2021/0309889 A1* | 10/2021 | Ueno | .............. C09J 153/02 |
| 2021/0309890 A1 | 10/2021 | Ueno et al. | |

FOREIGN PATENT DOCUMENTS

| CN | 102471650 A | 5/2012 |
| CN | 103254811 A | 8/2013 |
| CN | 104099032 A | 10/2014 |
| JP | 2011-151163 A | 8/2011 |
| JP | 2014-201672 A | 10/2014 |
| JP | 2016-117839 A | 6/2016 |
| JP | 2020-41008 A | 3/2020 |
| JP | 6790032 B2 | 11/2020 |
| JP | 2021-28392 A | 2/2021 |
| JP | 2021-28393 A | 2/2021 |
| TW | I730394 B | 6/2021 |
| WO | 2016/135997 A1 | 9/2016 |
| WO | 2020/049986 A1 | 3/2020 |

OTHER PUBLICATIONS

International Search Report of PCT/JP2019/032258 dated Oct. 29, 2019 [PCT/ISA/210].
Office Action issued Aug. 13, 2021 by the Taiwanese Patent Office in application No. 110117800.
Notice of Reasons for Refusal dated Oct. 19, 2021 from the Japanese Patent Office in Application No. 2020-184531.
Notice of Reasons for Refusal dated Oct. 19, 2021 from the Japanese Patent Office in Application No. 2020-184528.
First Office Action issued Jan. 19, 2022 by The State Intellectual Property Office of People's Republic of China in Chinese Application No. 201980058072.2.

\* cited by examiner

*Primary Examiner* — Anish P Desai
(74) *Attorney, Agent, or Firm* — Sughrue Mion, PLLC

(57) ABSTRACT

Provided is a pressure-sensitive adhesive sheet that may be used for the grinding of a hard and brittle substrate in a backgrinding step for the hard and brittle substrate, the pressure-sensitive adhesive sheet being excellent in all of low contamination property, productivity, grinding accuracy, and peelability. The pressure-sensitive adhesive sheet of the present invention includes a pressure-sensitive adhesive layer, wherein the pressure-sensitive adhesive layer has a thickness of from 1 μm to 300 μm, and wherein a microhardness H (Pa) of the pressure-sensitive adhesive layer at 25° C. and the thickness, which is represented by $h_A$ (μm), of the pressure-sensitive adhesive layer satisfy a relationship represented by the following expression (1). $\log H \geq 1.9385 \times \log h_A + 4.2611 \ldots$ (1).

15 Claims, 1 Drawing Sheet

ADHESIVE SHEET

CROSS REFERENCE TO RELATED APPLICATIONS

This application is a National Stage of International Application No. PCT/JP2019/032258 filed on Aug. 19, 2019, claiming priority based on Japanese Patent Application No. 2018-166994 filed on Sep. 6, 2018.

TECHNICAL FIELD

The present invention relates to a pressure-sensitive adhesive sheet.

BACKGROUND ART

In recent years, there has been an increasing need to accurately manufacture a ceramic substrate that is hard and brittle (hereinafter collectively referred to as "hard and brittle substrate"), such as: a sapphire substrate in use for, for example, a cover glass of an electronic device, a smartphone, or a timepiece, such as a substrate for a white LED or silicon on sapphire (SOS); a silicon carbide substrate, a gallium nitride substrate, a gallium oxide substrate, or a diamond substrate, which is expected to serve as a substrate for a power semiconductor; a silicon nitride substrate or an alumina nitride substrate, which is used as a heat-dissipating circuit board material for a power semiconductor; and a quartz substrate to be used for, for example, a crystal oscillator of glass or a lens. A typical example of a process for manufacturing such substrate is a backgrinding step of grinding a back surface of the substrate (wafer) to a desired thickness. In this step, a wax or a pressure-sensitive adhesive sheet (backgrinding tape) is used as a fixing material in order to fix the substrate. Of those, as compared to the wax, the pressure-sensitive adhesive sheet is less liable to contaminate the substrate, and is advantageously used from the viewpoint of productivity as well.

Meanwhile, the substrate (hard and brittle substrate) has high hardness. When the substrate (hard and brittle substrate) having high hardness is ground, the body to be ground (hard and brittle substrate) needs to be thinned by rotating a grinder while pressing fixed abrasive grains or loose abrasive grains, each of which is made of diamond or the like, against the body to be ground at a high load. During the grinding, a high perpendicular pressure is applied to the fixing material, and the related-art pressure-sensitive adhesive sheet is liable to cause problems with grindability, such as causing deformation of the pressure-sensitive adhesive layer and vibration of the body to be ground. In addition, a fixing material designed so as to solve those problems is increased in peel strength, resulting in a problem in that the ground body is contaminated when the ground body is peeled from the fixing material after the backgrinding step. As described above, it is difficult for the related-art fixing material to achieve both grindability and peelability in the grinding of the hard and brittle substrate.

CITATION LIST

Patent Literature

[PTL 1] JP 2011-151163 A

SUMMARY OF INVENTION

Technical Problem

The present invention has been made in order to solve the problems of the related art described above, and an object of the present invention is to provide a pressure-sensitive adhesive sheet that may be used for the grinding of a hard and brittle substrate in a backgrinding step for the hard and brittle substrate, the pressure-sensitive adhesive sheet being excellent in all of low contamination property, productivity, grinding accuracy, and peelability.

Solution to Problem

According to one embodiment of the present invention, there is provided a pressure-sensitive adhesive sheet, including a pressure-sensitive adhesive layer, wherein the pressure-sensitive adhesive layer has a thickness of from 1 μm to 300 μm, and wherein a microhardness H (Pa) of the pressure-sensitive adhesive layer at 25° C. and the thickness, which is represented by $h_A$ (μm), of the pressure-sensitive adhesive layer satisfy a relationship represented by the following expression (1).

$$\log H 1.9385 \times \log h_A + 4.2611 \tag{1}$$

In one embodiment, the pressure-sensitive adhesive sheet has, when a pressure-sensitive adhesive surface thereof is bonded to a silicon chip, a shear adhesive strength of 1.0 MPa or more under an ambient temperature of 25° C.

In one embodiment, the pressure-sensitive adhesive sheet has, when a pressure-sensitive adhesive surface thereof is bonded to SUS304BA, a peeling pressure-sensitive adhesive strength of 15 N/20 mm or less under an ambient temperature of 80° C.

In one embodiment, the pressure-sensitive adhesive layer has a microhardness H of from 10 MPa to 1 GPa at 25° C.

In one embodiment, the pressure-sensitive adhesive layer is formed from a pressure-sensitive adhesive containing a base polymer, and the base polymer is a thermoplastic elastomer.

In one embodiment, the thermoplastic elastomer is a styrene-based elastomer or an ethylene-vinyl acetate-based elastomer.

In one embodiment, the pressure-sensitive adhesive further contains a tackifying resin.

In one embodiment, a content of the tackifying resin is from 1 part by weight to 350 parts by weight with respect to 100 parts by weight of the base polymer.

In one embodiment, the pressure-sensitive adhesive sheet further includes a base material arranged on at least one side of the pressure-sensitive adhesive layer.

In one embodiment, the pressure-sensitive adhesive sheet further includes another pressure-sensitive adhesive layer arranged on at least one side of the pressure-sensitive adhesive layer.

In one embodiment, the base material has a tensile modulus of elasticity of from $1 \times 10^7$ Pa to $1 \times 10^{10}$ Pa at 25° C.

In one embodiment, the pressure-sensitive adhesive sheet is for use as a temporary fixing material during substrate processing in a semiconductor manufacturing process.

According to another embodiment of the present invention, there is provided a method of grinding a substrate. The method of grinding a substrate includes placing and fixing a substrate onto a pressure-sensitive adhesive layer of a pressure-sensitive adhesive sheet including the pressure-sensitive adhesive layer, and then grinding a surface of the substrate on an opposite side to a pressure-sensitive adhesive layer side, the pressure-sensitive adhesive layer having a thickness of from 1 µm to 300 µm, a microhardness H (Pa) of the pressure-sensitive adhesive layer at 25° C. and the thickness, which is represented by $h_A$ (µm), of the pressure-sensitive adhesive layer satisfying a relationship represented by the expression (1).

According to yet another embodiment of the present invention, there is provided a method of manufacturing a chip. The method of manufacturing a chip includes a grinding step including placing and fixing a substrate onto a pressure-sensitive adhesive layer of a pressure-sensitive adhesive sheet including the pressure-sensitive adhesive layer, and then grinding a surface of the substrate on an opposite side to a pressure-sensitive adhesive layer side, the pressure-sensitive adhesive layer having a thickness of from 1 µm to 300 µm, a microhardness H (Pa) of the pressure-sensitive adhesive layer at 25° C. and the thickness, which is represented by $h_A$ (µm), of the pressure-sensitive adhesive layer satisfying a relationship represented by the expression (1).

Advantageous Effects of Invention

According to the present invention, the pressure-sensitive adhesive sheet that may be used for the grinding of a hard and brittle substrate in a backgrinding step for the hard and brittle substrate, the pressure-sensitive adhesive sheet being excellent in all of low contamination property, productivity, grinding accuracy, and peelability, can be provided.

DESCRIPTION OF EMBODIMENTS

A. Outline of Pressure-Sensitive Adhesive Sheet

Figure 1:
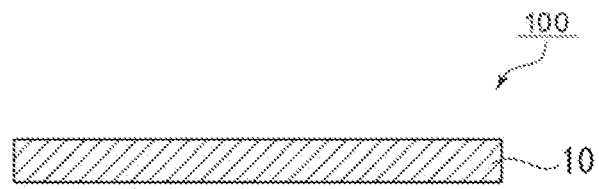
FIG. 1(a), FIG. 1(b), and FIG. 1(c) are each a schematic cross-sectional view of a pressure-sensitive adhesive sheet according to one embodiment of the present invention.
Figure 1:
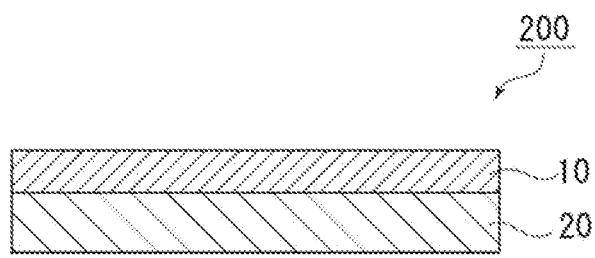
Figure 1:
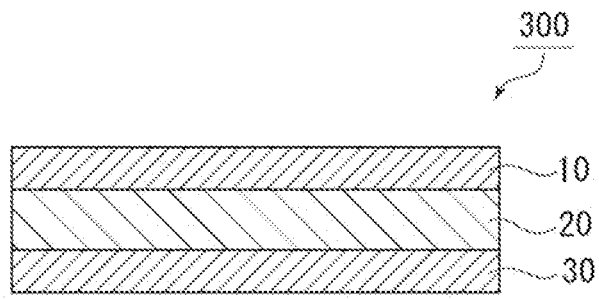

FIG. 1(a) is a schematic cross-sectional view of a pressure-sensitive adhesive sheet according to one embodiment of the present invention. A pressure-sensitive adhesive sheet 100 includes a pressure-sensitive adhesive layer 10. The pressure-sensitive adhesive sheet of the present invention may consist only of the pressure-sensitive adhesive layer 10, or may further include any appropriate layer in addition to the pressure-sensitive adhesive layer.

FIG. 1(b) is a schematic cross-sectional view of a pressure-sensitive adhesive sheet according to another embodiment of the present invention. A pressure-sensitive adhesive sheet 200 includes the pressure-sensitive adhesive layer 10 and a base material 20 arranged on at least one side of the pressure-sensitive adhesive layer 10. FIG. 1(c) is a schematic cross-sectional view of a pressure-sensitive adhesive sheet according to still another embodiment of the present invention. A pressure-sensitive adhesive sheet 300 includes the pressure-sensitive adhesive layer 10 and another pressure-sensitive adhesive layer 30 arranged on at least one side of the pressure-sensitive adhesive layer 10. The base material 20 may be arranged between the pressure-sensitive adhesive layer 10 and the other pressure-sensitive adhesive layer 30 as in the illustrated example, or the pressure-sensitive adhesive sheet may be formed of the pressure-sensitive adhesive layer and the other pressure-sensitive adhesive layer with the base material being omitted (not shown). In addition, the pressure-sensitive adhesive sheet may further include the following layers (not shown) as layers other than the pressure-sensitive adhesive layer: an elastic layer (to be described later in the section E), which is capable of imparting elasticity to the pressure-sensitive adhesive sheet; a separator (to be described later in the section F), which is peelably arranged on the pressure-sensitive adhesive layer; and the like.

With regard to the pressure-sensitive adhesive layer included in the pressure-sensitive adhesive sheet of the present invention, the microhardness H (Pa) of the pressure-sensitive adhesive layer at 25° C. and the thickness $h_A$ (µm) of the pressure-sensitive adhesive layer satisfy a relationship represented by the following expression (1). In addition, the thickness $h_A$ of the pressure-sensitive adhesive layer is from 1 µm to 300 µm.

$$\log H \geq 1.9385 \times \log h_A + 4.2611 \qquad (1)$$

In the present invention, by virtue of configuring the pressure-sensitive adhesive layer so that the microhardness H and the thickness $h_A$ satisfy the above-mentioned relationship while setting the thickness $h_A$ to from 1 µm to 300 µm, there can be obtained a pressure-sensitive adhesive sheet that is remarkably less liable to deform with respect to loading during grinding in a backgrinding step (namely, loading in a perpendicular direction and loading in a shear direction). In addition, the pressure-sensitive adhesive layer satisfying the above-mentioned relationship softens while keeping elastic deformation under high temperature (e.g., from 80° C. to 120° C.), and hence the pressure-sensitive adhesive sheet of the present invention can express excellent peelability after the grinding of a substrate. The pressure-sensitive adhesive sheet of the present invention having such characteristics can be suitably used as a temporary fixing material during substrate processing in a semiconductor manufacturing process, and can be particularly preferably used as a temporary fixing material in the grinding of a hard and brittle substrate. More specifically, in the grinding of the hard and brittle substrate having high hardness, a grinder needs to be rotated while being pressed against the body to be ground (sapphire) at a high load, and in this regard, when the pressure-sensitive adhesive sheet that is less liable to deform with respect to the loading during grinding as described above is used, the hard and brittle substrate can be ground with good accuracy. In addition, the pressure-sensitive adhesive sheet of the present invention is excellent in peelability, and hence is less liable to leave a pressure-sensitive adhesive layer component on the adherend when peeled therefrom. Also in this regard, the pressure-sensitive adhesive sheet of the present invention is useful as a temporary fixing material for the hard and brittle substrate. In one embodiment, a sapphire wafer is used as the hard and brittle substrate.

The microhardness H (Pa) of the pressure-sensitive adhesive layer at 25° C. and the thickness $h_A$ (µm) of the pressure-sensitive adhesive layer further satisfy preferably a relationship represented by the following expression (2), more preferably a relationship represented by the following expression (2)'.

$$1.9385 \times \log h_A + 9 \geq \log H \qquad (2)$$

$$1.9385 \times \log h_A + 7 \geq \log H \qquad (2)'$$

When the microhardness H and the thickness $h_A$ satisfy the above-mentioned relationship, a pressure-sensitive adhesive sheet more excellent in peelability can be obtained.

The pressure-sensitive adhesive sheet of the present invention has, when the pressure-sensitive adhesive surface thereof is bonded to a silicon chip, a shear adhesive strength under an ambient temperature of 25° C. of preferably 1.0 MPa or more, more preferably 1.5 MPa or more, still more preferably 2 MPa or more, particularly preferably 2.3 MPa or more, most preferably 3 MPa or more. The upper limit of the shear adhesive strength under an ambient temperature of 25° C. is, for example, 8 MPa. Herein, the shear adhesive strength may be measured by: fixing a silicon chip to the pressure-sensitive adhesive layer surface serving as a bonding surface by thermocompression bonding under the bonding conditions of 100° C. and 0.1 MPa for 1 minute with a heat pressing machine; using Dage 4000 manufactured by Nordson Corporation to apply an external force in a horizontal direction to the chip at a shear rate of 500 μm/sec. with a measuring terminal being set to a position at a height of 50 μm from the bonded surface; and reading the maximum breaking load from the thus obtained load-displacement curve. When a sample of interest is a single-sided tape, the measurement is performed under a state in which the sample is fixed by bonding the back surface of the base material (surface thereof on the opposite side to the pressure-sensitive adhesive layer) to a predetermined base with a double-sided tape NO. 585 manufactured by Nitto Denko Corporation. The shear adhesive strength of the pressure-sensitive adhesive sheet may be adjusted on the basis of, for example, the kind of the pressure-sensitive adhesive contained in the pressure-sensitive adhesive layer, the structure of the base polymer for forming the pressure-sensitive adhesive, and the kind and amount of an additive to be added to the pressure-sensitive adhesive.

The pressure-sensitive adhesive sheet of the present invention has, when the pressure-sensitive adhesive surface thereof is bonded to SUS304BA, a peeling pressure-sensitive adhesive strength under an ambient temperature of 80° C. of preferably 15 N/20 mm or less, more preferably 12 N/20 mm or less, still more preferably 10 N/20 mm or less, particularly preferably 8 N/20 mm or less. When the peeling pressure-sensitive adhesive strength falls within such ranges, the pressure-sensitive adhesive sheet can be made capable of being peeled off through heating. When a pressure-sensitive adhesive layer having a peeling pressure-sensitive adhesive strength within the above-mentioned ranges is formed, the pressure-sensitive adhesive sheet can be made excellent in peelability, less liable to contaminate a hard and brittle substrate (e.g., a sapphire wafer), and excellent in productivity. As used herein, the term "peeling pressure-sensitive adhesive strength" refers to a pressure-sensitive adhesive strength measured by: bonding the pressure-sensitive adhesive surface (pressure-sensitive adhesive layer surface) of the pressure-sensitive adhesive sheet (having a width of 20 mm) to SUS304BA with a hand roller to form a laminate; then subjecting the laminate to compression bonding at a pressure of 0.3 MPa for 1 minute with a heat pressing machine, which has been preheated to 80° C. in advance, to produce a sample; and peeling the pressure-sensitive adhesive sheet from the SUS304BA of the sample under the conditions of a peel angle of 180° and a peel rate of 300 mm/min. When the pressure-sensitive adhesive sheet is a pressure-sensitive adhesive sheet that includes no base material, the peeling pressure-sensitive adhesive strength may be measured as follows: a pressure-sensitive adhesive tape No. 315 manufactured by Nitto Denko Corporation is bonded to the surface of the pressure-sensitive adhesive sheet on the opposite side to the pressure-sensitive adhesive layer surface, and then the sample is produced. The peeling pressure-sensitive adhesive strength of the pressure-sensitive adhesive sheet may be adjusted on the basis of, for example, the kind of the pressure-sensitive adhesive contained in the pressure-sensitive adhesive layer, the structure of the base polymer for forming the pressure-sensitive adhesive, and the kind and amount of an additive to be added to the pressure-sensitive adhesive.

The pressure-sensitive adhesive sheet of the present invention may, while bonded to an object to be processed, be subjected to one or a combination of: the backgrinding step; a resin encapsulation step; a step of treating the back surface (ground surface) of the substrate (wafer), such as vapor deposition or sputtering; a dicing step; and a breaking step.

The thickness of the pressure-sensitive adhesive sheet of the present invention is preferably from 10 μm to 500 μm, more preferably from 20 μm to 300 μm.

According to another aspect of the present invention, there is provided a method of grinding a substrate through use of the pressure-sensitive adhesive sheet. This method includes, for example, placing and fixing a substrate onto the pressure-sensitive adhesive layer of the pressure-sensitive adhesive sheet, and then grinding the surface of the substrate on the opposite side to a pressure-sensitive adhesive layer side. Any appropriate method may be adopted for the grinding of the substrate. The grinding may be performed for the purpose of, for example, causing the substrate to have a desired thickness. In one embodiment, a wafer having a circular shape or an orientation flat shape may be used as the substrate. In addition, for example, a hard and brittle substrate (wafer), such as a sapphire substrate (sapphire wafer), may be used as the substrate.

According to still another aspect of the present invention, there is provided a method of manufacturing a chip through use of the pressure-sensitive adhesive sheet. This manufacturing method includes, for example, a grinding step including placing and fixing a substrate onto the pressure-sensitive adhesive layer of the pressure-sensitive adhesive sheet, and then grinding the surface of the substrate on the opposite side to a pressure-sensitive adhesive layer side. For example, a wafer having a circular shape or an orientation flat shape may be used as the substrate. In addition, the manufacturing method may include any appropriate step in addition to the grinding step. The manufacturing method may include, for example, a dicing step of cutting the substrate (wafer), a breaking step of dividing the cut body into chips after the dicing, a step of treating the back surfaces (ground surfaces) of the chips, such as vapor deposition or sputtering, and an encapsulation step of encapsulating each of the chips in a resin. Examples of the chips include LED chips each using, as a support, a hard and brittle wafer, such as a sapphire wafer.

B. Pressure-Sensitive Adhesive Layer

The pressure-sensitive adhesive layer contains a pressure-sensitive adhesive for imparting a pressure-sensitive adhesive property.

The microhardness H of the pressure-sensitive adhesive layer at 25° C. is preferably from 10 MPa to 1 GPa, more preferably from 12 MPa to 0.8 GPa, still more preferably from 15 MPa to 0.4 GPa. When the microhardness H falls within such ranges, there can be obtained a pressure-sensitive adhesive sheet that enables backgrinding to be performed with excellent grinding accuracy. When the microhardness H falls within such ranges, there can be obtained a pressure-sensitive adhesive sheet that enables backgrinding of a hard and brittle substrate (e.g., a sapphire wafer) to be performed with excellent grinding accuracy. The microhardness H is obtained by: perpendicularly pressing a Berkovich (triangular pyramid-shaped) probe made of diamond against the surface of the pressure-sensitive adhesive layer; and subjecting the thus obtained displacement-load hysteresis curve to numerical processing with software (TriboScan) included with a measurement apparatus. Herein, the microhardness H is a microhardness H measured with a nanoindenter (Triboindenter TI-950 manufactured by Hysitron, Inc.) by a single indentation method at a predetermined temperature (25° C.) under the measurement conditions of an indentation speed of about 500 nm/sec and an indentation depth of about 3,000 nm. The microhardness H of the pressure-sensitive adhesive layer may be adjusted on the basis of, for example, the kind of the pressure-sensitive adhesive contained in the pressure-sensitive adhesive layer, the structure of the base polymer for forming the pressure-sensitive adhesive, and the kind and amount of an additive to be added to the pressure-sensitive adhesive.

The thickness of the pressure-sensitive adhesive layer is preferably from 1 μm to 300 μm, more preferably from 1 μm to 250 μm, still more preferably from 1 μm to 100 μm, particularly preferably from 1 μm to 50 μm.

B-1. Pressure-Sensitive Adhesive

Any appropriate pressure-sensitive adhesive may be used as the pressure-sensitive adhesive for forming the pressure-sensitive adhesive layer as long as the effects of the present invention are obtained. Examples of the pressure-sensitive adhesive include pressure-sensitive adhesives containing, as a base polymer (pressure-sensitive adhesive resin), a thermoplastic elastomer, an acrylic resin, a silicone-based resin, a vinyl alkyl ether-based resin, a polyester-based resin, a polyamide-based resin, a urethane-based resin, a fluorinated resin, and the like. The pressure-sensitive adhesive preferably contains, as a base polymer, a thermoplastic resin. When the thermoplastic resin is used, there can be easily obtained a pressure-sensitive adhesive sheet that includes the pressure-sensitive adhesive layer satisfying the relational expression (1), and that can express excellent peelability through heating. As the base polymer, a pressure-sensitive adhesive containing an acrylic resin or a thermoplastic elastomer is preferably used, and a thermoplastic elastomer is more preferably used. As the thermoplastic elastomer, a styrene-based elastomer or an ethylene-vinyl acetate-based elastomer is preferably used, and a styrene-based elastomer is more preferably used. When, for example, a styrene-based elastomer is used, the adhesive property and microhardness H can be easily controlled by adjustment of the styrene unit ratio.

Examples of the styrene-based elastomer include a styrene-butadiene copolymer (SB), a styrene-isoprene copolymer (SI), a styrene-isoprene-styrene block copolymer (SIS), a styrene-butadiene-styrene block copolymer (SBS), a styrene-isobutylene-styrene copolymer (SIBS), a styrene-ethylene-butylene-styrene block copolymer (SEBS), a styrene-ethylene-propylene block copolymer (SEP), a styrene-ethylene-propylene-styrene block copolymer (SEPS), and modified products thereof. Of those, SEBS, SBS, SIS, and SIBS are preferred. Those copolymers are each preferably a block copolymer.

The content ratio of a constituent unit derived from styrene in the styrene-based elastomer is preferably from 10 parts by weight to 75 parts by weight, more preferably from 20 parts by weight to 70 parts by weight, still more preferably from 20 parts by weight to 50 parts by weight with respect to 100 parts by weight of the styrene-based elastomer. When the content ratio falls within such ranges, a pressure-sensitive adhesive layer having moderate elasticity and being excellent in pressure-sensitive adhesive property can be formed to provide a pressure-sensitive adhesive sheet that enables backgrinding to be performed with excellent grinding accuracy.

In one embodiment, an acid-modified styrene-based elastomer (preferably acid-modified SEBS, SBS, SIS, or SIBS) is used as the styrene-based elastomer. Examples of the acid to be used for the acid modification include maleic acid and maleic anhydride, and maleic acid modification is preferred. When the acid-modified styrene-based elastomer is used, the use of a cross-linking agent (e.g., an epoxy-based cross-linking agent) in combination therewith enables the adjustment of a molecular weight or the formation of a cross-linked structure. With this, the pressure-sensitive adhesive layer can be configured to soften while keeping elastic deformation in a high-temperature region, and its peel strength under high temperature can be controlled. The acid value of the acid-modified styrene-based elastomer is preferably 5 mg ($CH_3ONa$)/g or more, more preferably 7 mg ($CH_3ONa$)/g or more, still more preferably from 7 mg ($CH_3ONa$)/g to 25 mg ($CH_3ONa$)/g. The acid value in this case means the weight (mg) of sodium methoxide ($CH_3ONa$) that neutralizes 1 g of the base polymer. In addition, the acid value of the base polymer may be measured in conformity with JIS K0070:1992.

The content ratio of a constituent unit derived from vinyl acetate in the ethylene-vinyl acetate-based elastomer is preferably from 5 parts by weight to 50 parts by weight, more preferably from 10 parts by weight to 45 parts by weight with respect to 100 parts by weight of the ethylene-vinyl acetate-based elastomer. When the content ratio falls within such ranges, a pressure-sensitive adhesive layer having moderate elasticity and being excellent in pressure-sensitive adhesive property can be formed to provide a pressure-sensitive adhesive sheet that enables backgrinding to be performed with excellent grinding accuracy.

As the acrylic resin, for example, an acrylic resin containing one kind or two or more kinds of (meth)acrylic acid alkyl esters as a monomer component is used. Specific examples of the (meth)acrylic acid alkyl ester include (meth) acrylic acid C1-20 alkyl esters, such as methyl (meth) acrylate, ethyl (meth)acrylate, propyl (meth)acrylate, isopropyl (meth)acrylate, butyl (meth)acrylate, isobutyl (meth) acrylate, s-butyl (meth)acrylate, t-butyl (meth)acrylate, pentyl (meth)acrylate, hexyl (meth)acrylate, heptyl (meth) acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth) acrylate, and eicosyl (meth)acrylate. Of those, a (meth) acrylic acid alkyl ester having a linear or branched alkyl group having 4 to 18 carbon atoms may be preferably used.

The acrylic polymer may contain a unit corresponding to any other monomer component copolymerizable with the (meth)acrylic acid alkyl ester, as required, for the purpose of modification of cohesive strength, heat resistance, cross-linkability, or the like. Examples of such monomer component include: carboxyl group-containing monomers, such as acrylic acid, methacrylic acid, carboxyethyl acrylate, carboxypentyl acrylate, itaconic acid, maleic acid, fumaric acid, and crotonic acid; acid anhydride monomers, such as maleic anhydride and itaconic anhydride; hydroxyl group-containing monomers, such as hydroxyethyl (meth)acrylate, hydroxypropyl (meth)acrylate, hydroxybutyl (meth)acrylate, hydroxyhexyl (meth)acrylate, hydroxyoctyl (meth)

acrylate, hydroxydecyl (meth)acrylate, hydroxylauryl (meth)acrylate, and (4-hydroxymethylcyclohexyl)methyl methacrylate; sulfonic acid group-containing monomers, such as styrenesulfonic acid, allylsulfonic acid, 2-(meth) acrylamido-2-methylpropanesulfonic acid, (meth)acrylamidopropanesulfonic acid, sulfopropyl (meth)acrylate, and (meth)acryloyloxynaphthalenesulfonic acid; (N-substituted) amide-based monomers, such as (meth)acrylamide, N,N-dimethyl(meth)acrylamide, N-butyl(meth)acrylamide, N-methylol (meth)acrylamide, and N-methylolpropane (meth)acrylamide; aminoalkyl (meth)acrylate-based monomers, such as aminoethyl (meth)acrylate, N,N-dimethylaminoethyl (meth)acrylate, and t-butylaminoethyl (meth)acrylate; alkoxyalkyl (meth)acrylate-based monomers, such as methoxyethyl (meth)acrylate and ethoxyethyl (meth)acrylate; maleimide-based monomers, such as N-cyclohexylmaleimide, N-isopropylmaleimide, N-laurylmaleimide, and N-phenylmaleimide; itaconimide-based monomers, such as N-methyl itaconimide, N-ethyl itaconimide, N-butyl itaconimide, N-octyl itaconimide, N-2-ethylhexyl itaconimide, N-cyclohexyl itaconimide, and N-lauryl itaconimide; succinimide-based monomers, such as N-(meth)acryloyloxymethylene succinimide, N-(meth)acryloyl-6-oxyhexamethylene succinimide, and N-(meth)acryloyl-8-oxyoctamethylene succinimide; vinyl-based monomers, such as vinyl acetate, vinyl propionate, N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxylic acid amides, styrene, α-methylstyrene, and N-vinylcaprolactam; cyanoacrylate monomers, such as acrylonitrile and methacrylonitrile; epoxy group-containing acrylic monomers, such as glycidyl (meth)acrylate; glycol-based acrylic ester monomers, such as polyethylene glycol (meth) acrylate, polypropylene glycol (meth)acrylate, methoxyethylene glycol (meth)acrylate, and methoxypolypropylene glycol (meth)acrylate; acrylic ester-based monomers each having, for example, a heterocycle, a halogen atom, or a silicon atom, such as tetrahydrofurfuryl (meth)acrylate, fluorine (meth)acrylate, and silicone (meth)acrylate; polyfunctional monomers, such as hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri (meth)acrylate, pentaerythritol tri(meth)acrylate, dipentaerythritol hexa(meth)acrylate, epoxy acrylate, polyester acrylate, and urethane acrylate; olefin-based monomers, such as isoprene, butadiene, and isobutylene; and vinyl ether-based monomers, such as vinyl ether. Those monomer components may be used alone or in combination thereof.

The pressure-sensitive adhesive may contain any appropriate additive as required. Examples of the additive include a tackifying resin, a plasticizer, a pigment, a dye, a filler, an age resistor, a conductive material, an antistatic agent, a UV absorber, a light stabilizer, a peeling modifier, a softener, a surfactant, a flame retardant, an antioxidant, and a crosslinking agent.

In one embodiment, the pressure-sensitive adhesive contains a tackifying resin. Particularly when the pressure-sensitive adhesive contains the styrene-based elastomer, it is preferred to use the elastomer and the tackifying resin in combination. When the tackifying resin is used in combination, a pressure-sensitive adhesive layer excellent in pressure-sensitive adhesive property can be formed.

Any appropriate tackifying resin is used as the tackifying resin as long as the effects of the present invention are obtained. Specific examples of the tackifying resin include a rosin-based tackifying resin (such as unmodified rosin, modified rosin, a rosin phenol-based resin, or a rosin ester-based resin), a terpene-based tackifying resin (such as a terpene-based resin, a terpene phenol-based resin, a styrene-modified terpene-based resin, an aromatic modified terpene-based resin, or a hydrogenated terpene-based resin), a hydrocarbon-based tackifying resin (such as an aliphatic hydrocarbon resin, an aliphatic cyclic hydrocarbon resin, an alicyclic hydrocarbon resin (e.g., a styrene-based resin or a xylene-based resin), an aliphatic/aromatic petroleum resin, an aliphatic/alicyclic petroleum resin, a hydrogenated hydrocarbon resin, a coumarone-based resin, or a coumarone indene-based resin), a phenol-based tackifying resin (such as an alkylphenol-based resin, a xylene formaldehyde-based resin, resol, or novolac), a ketone-based tackifying resin, a polyamide-based tackifying resin, an epoxy-based tackifying resin, and an elastomer-based tackifying resin. Of those, a terpene-based tackifying resin, a rosin-based tackifying resin, or a hydrocarbon-based tackifying resin (preferably an alicyclic saturated hydrocarbon resin) is preferred. The tackifying resins may be used alone or in combination.

The content of the tackifying resin is preferably from 0 parts by weight to 350 parts by weight, more preferably from 1 part by weight to 350 parts by weight, still more preferably from 1 part by weight to 300 parts by weight, particularly preferably from 20 parts by weight to 250 parts by weight with respect to 100 parts by weight of the base polymer. When the content falls within such ranges, a pressure-sensitive adhesive layer excellent in pressure-sensitive adhesive property can be formed. When the content of the tackifying resin is excessively high, the pressure-sensitive adhesive layer may become brittle.

In one embodiment, the pressure-sensitive adhesive contains a surfactant. When the pressure-sensitive adhesive containing the surfactant is used, a light-peel layer is formed in the pressure-sensitive adhesive layer through segregation of the surfactant by heating, and hence a pressure-sensitive adhesive sheet excellent in peelability can be obtained.

Any appropriate surfactant may be used as the surfactant as long as the effects of the present invention are obtained. Examples of the surfactant include a nonionic surfactant, an anionic surfactant, a cationic surfactant, and a zwitterionic surfactant. Of those, a nonionic surfactant, an anionic surfactant, or a cationic surfactant is preferably used, and a nonionic surfactant or a cationic surfactant is more preferably used. The surfactants may be used alone or in combination thereof.

Examples of the nonionic surfactant include: a polyoxyethylene alkyl ether, such as a polyoxyethylene lauryl ether or a polyoxyethylene stearyl ether; a polyoxyethylene alkylphenyl ether, such as a polyoxyethylene octylphenyl ether or a polyoxyethylene nonylphenyl ether; a sorbitan fatty acid ester, such as sorbitan monolaulate, sorbitan monostearate, or polyoxyethylene sorbitan monolaulate; a polyoxyethylene glyceryl ether fatty acid ester; a polyoxyethylene-polyoxypropylene block copolymer; a saturated fatty acid ester, such as ethyl caprylate, ethyl caprate, methyl laurate, butyl laurate, methyl myristate, isopropyl myristate, methyl palmitate, isopropyl palmitate, methyl stearate, butyl stearate, methyl behenate, butyl laurate, butyl stearate, isopropyl myristate, or isopropyl palmitate; and a fatty acid amide, such as lauramide, palmitamide, stearamide, or behenamide.

In one embodiment, a phosphoric acid ester compound is used as the surfactant (nonionic surfactant). Examples of the phosphoric acid ester compound include: an alkyl phosphate, such as isopropyl phosphate or lauryl phosphate; a polyoxyalkylene alkyl ether phosphate; and salts thereof. Of those, a polyoxyalkylene alkyl ether phosphate is preferred.

When the phosphoric acid ester-based compound is a salt, as a counter ion for forming the salt, there are given, for example, cations, such as an alkali metal, ammonium, and organic ammonium. Examples of the alkali metal include sodium, potassium, and lithium. Examples of the organic ammonium include: an alkylamine, such as methylamine or ethylamine; and an alkanolamine, such as monoethanolamine, diethanolamine, or triethanolamine.

Examples of the polyoxyalkylene alkyl ether phosphate include polyoxyethylene capryl ether phosphate, polyoxyethylene decyl ether phosphate, polyoxyethylene lauryl ether phosphate, polyoxyethylene tridecyl ether phosphate, polyoxyethylene myristyl ether phosphate, polyoxyethylene pentadecyl ether phosphate, and polyoxyethylene stearyl ether phosphate. When the polyoxyalkylene alkyl ether phosphate is a salt, for example, sodium, potassium, barium, triethanolamine, or the like is preferably selected as a counter ion for forming the salt.

The number of moles added of ethylene oxides in the polyoxyalkylene alkyl ether phosphate is preferably from 1 to 20, more preferably from 1 to 10, still more preferably from 1 to 6, particularly preferably from 1 to 4.

Examples of the anionic surfactant include: an alkyl sulfate, such as lauryl sulfate or octadecyl sulfate; a fatty acid salt; an alkylbenzene sulfonate, such as nonylbenzene sulfonate or dodecylbenzene sulfonate; a naphthalene sulfonate, such as dodecylnaphthalene sulfonate; an alkyl diphenyl ether disulfonate, such as dodecyl diphenyl ether disulfonate; a polyoxyethylene alkyl ether sulfate, such as polyoxyethylene octadecyl ether sulfate or polyoxyethylene lauryl ether sulfate; a polyoxyethylene alkylphenyl ether sulfate, such as polyoxyethylene laurylphenyl ether sulfate; a polyoxyethylene styrenated phenyl ether sulfate; a sulfosuccinate, such as lauryl sulfosuccinate, polyoxyethylene lauryl sulfosuccinate, or dioctyl sulfosuccinate (dioctyl sodium sulfosuccinate); a polyoxyethylene alkyl ether phosphate; and a polyoxyethylene alkyl ether acetate. When the anionic surfactant forms a salt, the salt may be, for example, a metal salt (preferably a monovalent metal salt), such as a sodium salt, a potassium salt, a calcium salt, or a magnesium salt, or an ammonium salt or an amine salt.

Examples of the cationic surfactant include an alkyltrimethylammonium chloride, stearyltrimethylammonium chloride, lauryltrimethylammonium chloride, cetyltrimethylammonium chloride, a beef tallow alkyltrimethylammonium chloride, behenyltrimethylammonium chloride, stearyltrimethylammonium bromide, behenyltrimethylammonium bromide, distearyldimethylammonium chloride, dicocoyldimethylammonium chloride, dioctyldimethylammonium chloride, di(POE)oleylmethylammonium(2EO) chloride, benzalkonium chloride, an alkylbenzalkonium chloride, an alkyldimethylbenzalkonium chloride, benzethonium chloride, stearyldimethylbenzylammonium chloride, a lanolin-derived quaternary ammonium salt, diethylaminoethylamide stearate, dimethylaminopropylamide stearate, behenic acid amidepropyldimethylhydroxypropylammonium chloride, stearoyl colaminoformyl methylpyridinium chloride, cetylpyridinium chloride, a tall oil alkylbenzyl hydroxyethylimidazolinium chloride, and a benzylammonium salt.

A commercially available product may be used as the surfactant. Examples of the commercially available surfactant include: phosphoric acid ester-based surfactants, such as a product manufactured under the product name "PHOSPHANOL RL210" by Toho Chemical Industry Co., Ltd.; fatty acid ester-based surfactants, such as a product manufactured under the product name "EXCEPARL IPP" by Kao Corporation and methyl palmitate manufactured by Tokyo Chemical Industry Co., Ltd.; fatty acid amide-based surfactants, such as stearamide and lauramide manufactured by Tokyo Chemical Industry Co., Ltd.; fatty acid aminoalkyl-amide-based surfactants, such as a product manufactured under the product name "CATINAL MAPS" by Toho Chemical Industry Co., Ltd.; trimethylammonium chloride-based surfactants, such as a product manufactured under the product name "CATINAL STC-70ET" by Toho Chemical Industry Co., Ltd.; dimethylbenzylammonium chloride-based surfactants, such as a product manufactured under the product name "CATION S" by Sanyo Chemical Industries, Ltd.; succinic anhydride-based surfactants, such as products manufactured under the product names "DSA" and "PDSA-DA" by Sanyo Chemical Industries, Ltd.; and sodium sulfosuccinate-based surfactants, such as a product manufactured under the product name "SANSEPARER 100" by Sanyo Chemical Industries, Ltd.

In one embodiment, the surfactant has an alkyl group as a hydrophobic group. It is preferred to use a surfactant having a linear or branched (preferably linear) alkyl group having 5 to 20 (more preferably 8 to 18, still more preferably 10 to 18) carbon atoms. When such surfactant is used, there can be obtained a pressure-sensitive adhesive sheet capable of exhibiting excellent peelability under high temperature without the impairment of its pressure-sensitive adhesive property at ordinary temperature.

The content of the surfactant is preferably from 0.001 part by weight to 15 parts by weight, more preferably from 0.01 part by weight to 10 parts by weight, still more preferably from 0.1 part by weight to 8 parts by weight, particularly preferably from 1 part by weight to 5 parts by weight with respect to 100 parts by weight of the base polymer. When the content falls within such ranges, there can be obtained a pressure-sensitive adhesive sheet capable of exhibiting excellent peelability even under high temperature.

The molecular weight of the surfactant is preferably 800 or less, more preferably 600 or less, still more preferably 500 or less. The lower limit of the molecular weight of the surfactant is, for example, 150. When the molecular weight falls within such ranges, there can be obtained a pressure-sensitive adhesive sheet capable of exhibiting excellent peelability even under high temperature.

In one embodiment, the pressure-sensitive adhesive contains a cross-linking agent. When the pressure-sensitive adhesive contains the cross-linking agent, the cohesive strength of the pressure-sensitive adhesive layer can be adjusted, and hence there can be obtained a pressure-sensitive adhesive sheet excellent in peelability under high temperature while having an excellent adhesive property under ordinary temperature.

Any appropriate cross-linking agent may be used as the cross-linking agent as long as the effects of the present invention are obtained. Examples of the cross-linking agent include an epoxy-based cross-linking agent, an isocyanate-based cross-linking agent, a melamine-based cross-linking agent, a peroxide-based cross-linking agent, a urea-based cross-linking agent, a metal alkoxide-based cross-linking agent, a metal chelate-based cross-linking agent, a metal salt-based cross-linking agent, a carbodiimide-based cross-linking agent, an oxazoline-based cross-linking agent, an aziridine-based cross-linking agent, and an amine-based cross-linking agent. Of those, an epoxy-based cross-linking agent is preferred.

Examples of the epoxy-based cross-linking agent include N,N,N',N'-tetraglycidyl-m-xylenediamine, diglycidylaniline, 1,3-bis(N,N-glycidylaminomethyl)cyclohexane (manufactured by Mitsubishi Gas Chemical Company, Inc., product name: "TETRAD-C"), 1,6-hexanediol diglycidyl ether (manufactured by Kyoeisha Chemical Co., Ltd., product name: "Epolite 1600"), neopentyl glycol diglycidyl ether (manufactured by Kyoeisha Chemical Co., Ltd., product name: "Epolite 1500NP"), ethylene glycol diglycidyl ether (manufactured by Kyoeisha Chemical Co., Ltd., product name: "Epolite 40E"), propylene glycol diglycidyl ether (manufactured by Kyoeisha Chemical Co., Ltd., product name: "Epolite 70P"), polyethylene glycol diglycidyl ether (manufactured by NOF Corporation, product name: "EPIOL E-400"), polypropylene glycol diglycidyl ether (manufactured by NOF Corporation, product name: "EPIOL P-200"), sorbitol polyglycidyl ether (manufactured by Nagase ChemteX Corporation, product name: "Denacol EX-611"), glycerol polyglycidyl ether (manufactured by Nagase ChemteX Corporation, product name: "Denacol EX-314"), pentaerythritol polyglycidyl ether, polyglycerol polyglycidyl ether (manufactured by Nagase ChemteX Corporation, product name: "Denacol EX-512"), sorbitan polyglycidyl ether, trimethylolpropane polyglycidyl ether, adipic acid diglycidyl ester, o-phthalic acid diglycidyl ester, triglycidyl-tris (2-hydroxyethyl) isocyanurate, resorcin diglycidyl ether, bisphenol-S-diglycidyl ether, and an epoxy-based resin having two or more epoxy groups in a molecule thereof. The content of the epoxy-based cross-linking agent may be set to any appropriate amount depending on, for example, desired pressure-sensitive adhesive strength of the pressure-sensitive adhesive sheet and desired elasticity of the pressure-sensitive adhesive layer, and is typically from 0.01 part by weight to 10 parts by weight, preferably from 0.03 part by weight to 5 parts by weight with respect to 100 parts by weight of the base polymer.

In addition, the pressure-sensitive adhesive layer may contain any appropriate foaming agent. The foaming agent is an additive that can foam through heating. Any appropriate foaming agent is used as the foaming agent as long as the effects of the present invention are obtained. Thermally expandable microspheres may be typically used as the foaming agent. When a pressure-sensitive adhesive sheet including a pressure-sensitive adhesive layer containing the thermally expandable microspheres is heated, the thermally expandable microspheres expand or foam to cause unevenness on its pressure-sensitive adhesive surface, with the result that its pressure-sensitive adhesive strength is decreased or lost. Such pressure-sensitive adhesive sheet can be easily peeled off through heating.

The foaming starting temperature of the foaming agent is preferably 90° C. or more, more preferably from 90° C. to 220° C., still more preferably from 100° C. to 190° C. Herein, the foaming starting temperature corresponds to, for example, the lowest temperature at which the pressure-sensitive adhesive strength of the pressure-sensitive adhesive layer becomes 10% or less with respect to the ordinary-state pressure-sensitive adhesive strength (pressure-sensitive adhesive strength for a PET film at 23° C.) of the pressure-sensitive adhesive layer. The term "pressure-sensitive adhesive strength" as used in this case refers to a pressure-sensitive adhesive strength measured by a method in conformity with JIS Z 0237:2000 (bonding conditions: one pass back and forth with a 2 kg roller, peel rate: 300 mm/min, peel angle: 180°). In addition, the pressure-sensitive adhesive strength at the foaming starting temperature (and of a measurement sample after heating) is measured after the measurement sample has been returned to ordinary temperature (23° C.). When the foaming agent is thermally expandable microspheres, a temperature at which the thermally expandable microspheres start to expand corresponds to the foaming starting temperature.

Any appropriate thermally expandable microspheres may be used as the thermally expandable microspheres. For example, microspheres each obtained by encapsulating a substance which easily expands through heating in a shell having elasticity may be used as the thermally expandable microspheres. Such thermally expandable microspheres may be manufactured by any appropriate method, such as a coacervation method or an interfacial polymerization method.

Examples of the substance which easily expands through heating include: a low-boiling point liquid, such as propane, propylene, butene, n-butane, isobutane, isopentane, neopentane, n-pentane, n-hexane, isohexane, heptane, octane, petroleum ether, a halomethane, or a tetraalkylsilane; and azodicarbonamide, which is gasified by thermal decomposition.

An example of the constituent substance for the shell is a polymer constituted of: a nitrile monomer, such as acrylonitrile, methacrylonitrile, α-chloroacrylonitrile, α-ethoxyacrylonitrile, or fumaronitrile; a carboxylic acid monomer, such as acrylic acid, methacrylic acid, itaconic acid, maleic acid, fumaric acid, or citraconic acid; vinylidene chloride; vinyl acetate; a (meth)acrylic acid ester, such as methyl (meth)acrylate, ethyl (meth)acrylate, n-butyl (meth)acrylate, isobutyl (meth)acrylate, t-butyl (meth)acrylate, isobornyl (meth)acrylate, cyclohexyl (meth)acrylate, benzyl (meth)acrylate, or β-carboxyethyl acrylate; a styrene monomer, such as styrene, α-methylstyrene, or chlorostyrene; or an amide monomer, such as acrylamide, a substituted acrylamide, methacrylamide, or a substituted methacrylamide. The polymer constituted of such monomer may be a homopolymer, or may be a copolymer. Examples of the copolymer include a vinylidene chloride-methyl methacrylate-acrylonitrile copolymer, a methyl methacrylate-acrylonitrile-methacrylonitrile copolymer, a methyl methacrylate-acrylonitrile copolymer, and an acrylonitrile-methacrylonitrile-itaconic acid copolymer.

Commercially available thermally expandable microspheres may be used as the thermally expandable microspheres. Specific examples of the commercially available thermally expandable microspheres include: products manufactured under the product name "Matsumoto Microsphere" (grade: F-30, F-30D, F-36D, F-36LV, F-50, F-50D, F-65, F-65D, FN-100SS, FN-100SSD, FN-180SS, FN-180SSD, F-190D, F-260D, and F-2800D) by Matsumoto Yushi-Seiyaku Co., Ltd.; products manufactured under the product name "Expancel" (grade: 053-40, 031-40, 920-40, 909-80, and 930-120) by Japan Fillite Co., Ltd.; products manufactured under the product name "DAIFOAM" (grade: H750, H850, H1100, S2320D, S2640D, M330, M430, and M520) by Kureha Chemical Industry Co., Ltd.; and products manufactured under the product name "ADVANCELL" (grade: EML101, EMH204, EHM301, EHM302, EHM303, EM304, EHM401, EM403, and EM501) by Sekisui Chemical Co., Ltd.

Under an ambient temperature of 25° C., the average particle diameter of the thermally expandable microspheres before the foaming of the thermally expandable microspheres is preferably 50 μm or less, more preferably from 1 μm to 50 μm, still more preferably from 3 μm to 35 μm, particularly preferably from 5 μm to 35 μm. When thermally expandable microspheres having an average particle diameter of 50 μm or less are used, before the foaming of the thermally expandable microspheres (i.e., in a situation in which the pressure-sensitive adhesive layer needs to have a pressure-sensitive adhesive property), the thermally expandable microspheres hardly affect the pressure-sensitive adhesive layer surface, and hence there can be obtained a pressure-sensitive adhesive sheet having an excellent pressure-sensitive adhesive property with high adhesiveness to an adherend. The average particle diameter of the thermally expandable microspheres is preferably as large as possible within the above-mentioned ranges because the thermally expandable microspheres expand more when heated. When thermally expandable microspheres having an average particle diameter within the above-mentioned ranges are used, a pressure-sensitive adhesive sheet excellent in peelability can be obtained. The average particle diameter of the thermally expandable microspheres may be controlled on the basis of, for example, conditions for the polymerization of the thermally expandable microspheres (e.g., the rotation speed of a stirring blade during the polymerization, and a polymerization temperature). In addition, when commercially available thermally expandable microspheres are used, the average particle diameter may be controlled by classification treatment, such as mesh treatment, filter treatment, or centrifugal treatment. Herein, the average particle diameter may be measured by observing the thermally expandable microspheres to be used, or thermally expandable microspheres removed from the pressure-sensitive adhesive layer before heating, through use of an optical microscope or an electron microscope. In addition, the average particle diameter may be measured by a particle size distribution measurement method in a laser scattering method. More specifically, the average particle diameter may be measured using a particle size distribution measurement apparatus (e.g., a product manufactured under the product name "SALD-2000J" by Shimadzu Corporation) after the thermally expandable microspheres to be used have been dispersed in a predetermined solvent (e.g., water).

It is preferred that the thermally expandable microspheres each have such a moderate strength that rupture does not occur until a volume expansion ratio reaches preferably 5 times or more, more preferably 7 times or more, still more preferably 10 times or more. When such thermally expandable microspheres are used, the pressure-sensitive adhesive strength can be efficiently lowered through heat treatment.

The content of the thermally expandable microspheres in the pressure-sensitive adhesive layer may be appropriately set depending on, for example, a desired decreasing property of the pressure-sensitive adhesive strength. The content of the thermally expandable microspheres is preferably from 20 parts by weight to 210 parts by weight, more preferably from 30 parts by weight to 200 parts by weight, still more preferably from 50 parts by weight to 150 parts by weight with respect to 100 parts by weight of the base polymer. When the content falls within such ranges, there can be obtained a pressure-sensitive adhesive sheet that shows a satisfactory adhesive property during backgrinding, and that allows an adherend to be easily peeled therefrom when heated.

The content ratio of the thermally expandable microspheres in the pressure-sensitive adhesive layer is preferably from 5 wt % to 80 wt %, more preferably from 10 wt % to 70 wt %, still more preferably from 15 wt % to 65 wt % with respect to the weight of the pressure-sensitive adhesive layer. The content ratio of the thermally expandable microspheres may be calculated from the volume filling ratio (volume filling ratio at a temperature equal to or lower than the foaming starting temperature (e.g., at 23° C.)) of the thermally expandable microspheres obtained by X-ray CT analysis, SEM analysis, or the like, the specific gravity of the thermally expandable microspheres, and the specific gravity of a region other than the thermally expandable microspheres. In one embodiment, the calculation may be performed on the basis of a rough estimate that the specific gravity of the thermally expandable microspheres is 1 and the specific gravity of the region other than the thermally expandable microspheres is 1, and the content ratio of the thermally expandable microspheres in this case falls within the above-mentioned ranges.

The content ratio of the thermally expandable microspheres in the pressure-sensitive adhesive layer is preferably from 5 vol % to 80 vol %, more preferably from 10 vol % to 70 vol %, still more preferably from 15 vol % to 65 vol % with respect to the volume of the pressure-sensitive adhesive layer. The volume-based content ratio corresponds to the volume filling ratio, and as described above, may be measured by X-ray CT analysis, SEM analysis, or the like. More specifically, the volume filling ratio may be measured by the following method.

<Volume Filling Ratio Measurement Method> i) The pressure-sensitive adhesive sheet before heating in a state in which the pressure-sensitive adhesive layer thereof is directed upward is used as a sample and fixed to a holder, and 1,601 successive transmission images thereof are taken by X-ray CT at from 0° to 180°. In the X-ray CT, measurement is performed with ZEISS, Xradia 520 Versa at a tube voltage of 40 kV, a tube current of 73 μA, and a pixel size of 0.3 μm/pixel.

ii) Reconstruction is performed on the basis of the resultant full transmission images to create tomographic images, and a three-dimensional reconstructed image (TIF stack image) and a reconstructed cross-sectional image (three-sided view) are created using analytical software ImageJ.

iii) The resultant three-dimensional reconstructed image (TIF stack image) is subjected to image processing to identify the thermally expandable microspheres. On the basis of the results of the identification, a volume filling ratio in a thickness direction, the volumes of individual foams, and the sphere-equivalent diameters thereof are calculated.

The thickness of the pressure-sensitive adhesive layer of each sample is measured by SEM cross-sectional observation, and the filling ratio is calculated using a value excluding cell portions as a total volume.

An inorganic foaming agent or an organic foaming agent may be used as the foaming agent. Examples of the inorganic foaming agent include ammonium carbonate, ammonium hydrogen carbonate, sodium hydrogen carbonate, ammonium nitrite, sodium boron hydroxide, and various azides. In addition, examples of the organic foaming agent include: a chlorofluoroalkane-based compound, such as trichloromonofluoromethane or dichloromonofluoromethane; an azo-based compound, such as azobisisobutyronitrile, azodicarbonamide, or barium azodicarboxylate; a hydrazine-based compound, such as p-toluenesulfonylhydrazide, diphenyl sulfone-3,3'-disulfonylhydrazide, 4,4'-oxybis(benzenesulfonylhydrazide), or allylbis(sulfonylhydrazide); a semicarbazide-based compound, such as p-toluylenesulfonylsemicarbazide or 4,4'-oxybis(benzenesulfonylsemicarbazide); a triazole-based compound, such as 5-morpholyl-1,2,3,4-thiatriazole; and an N-nitroso-based compound, such as N,N'-dinitrosopentamethylenetetramine or N,N'-dimethyl-N,N'-dinitrosoterephthalamide.

C. Base Material

Examples of the base material include a resin sheet, a nonwoven fabric, paper, metal foil, a woven fabric, a rubber sheet, a foamed sheet, and laminates thereof (particularly a laminate containing a resin sheet). As a resin for forming the resin sheet, there are given, for example, polyethylene terephthalate (PET), polyethylene naphthalate (PEN), polybutylene terephthalate (PBT), polyethylene (PE), polypropylene (PP), an ethylene-propylene copolymer, an ethylene-vinyl acetate copolymer (EVA), polyamide (nylon), wholly aromatic polyamide (aramid), polyimide (PI), polyvinyl chloride (PVC), polyphenylene sulfide (PPS), a fluorine-based resin, and polyether ether ketone (PEEK). Examples of the non-woven fabric include: non-woven fabrics of natural fibers each having heat resistance, such as a non-woven fabric containing Manila hemp; and non-woven fabrics of synthetic resins, such as a non-woven fabric of a polypropylene resin, a non-woven fabric of a polyethylene resin, and a non-woven fabric of an ester-based resin. Examples of the metal foil include copper foil, stainless-steel foil, and aluminum foil. Examples of the paper include Japanese paper and kraft paper. The base material may be a single layer or a multilayer. When the base material is a multilayer, the configurations of its layers may be identical to or different from each other.

The thickness of the base material may be set to any appropriate thickness depending on, for example, desired strength or flexibility, and intended use. The thickness of the base material is preferably 1,000 μm or less, more preferably from 1 μm to 1,000 μm, still more preferably from 1 μm to 500 μm, particularly preferably from 3 μm to 300 μm, most preferably from 5 μm to 250 μm.

The tensile modulus of elasticity of the base material at 25° C. is from $1\times10^7$ Pa to $1\times10^{10}$ Pa, more preferably from $5\times10^7$ Pa to $5\times10^9$ Pa. When the tensile modulus of elasticity falls within such ranges, there can be obtained a pressure-sensitive adhesive sheet that enables a hard and brittle substrate (e.g., a sapphire wafer) to be ground with good accuracy.

The base material may be subjected to surface treatment. Examples of the surface treatment include corona treatment, chromic acid treatment, ozone exposure, flame exposure, high-voltage electric shock exposure, ionizing radiation treatment, and coating treatment with an undercoating agent. Examples of the organic coating material include materials described in "Plastic Hard Coat Material II (CMC Publishing Co., Ltd., (2004))." A urethane-based polymer is preferably used, and polyurethane acrylate, polyester polyurethane, or a precursor thereof is more preferably used. This is because of the following reasons: any such material can be easily coated and applied onto the base material; and many kinds of the material can be industrially selected and are each available at low cost. The urethane-based polymer is, for example, a polymer formed of a reacted mixture of an isocyanate monomer and an alcoholic hydroxy group-containing monomer (e.g., a hydroxy group-containing acrylic compound or a hydroxy group-containing ester compound). The organic coating material may contain, as an optional additive, a chain extender, such as polyamine, an age resistor, an oxidation stabilizer, or the like. The thickness of an organic coating layer is not particularly limited, but is suitably, for example, from about 0.1 μm to about 10 μm, preferably from about 0.1 μm to about 5 μm, more preferably from about 0.5 μm to about 5 μm.

D. Other Pressure-Sensitive Adhesive Layer

Any appropriate pressure-sensitive adhesive layer may be formed as the other pressure-sensitive adhesive layer. As a pressure-sensitive adhesive for forming the other pressure-sensitive adhesive layer, there are given, for example, a rubber-based pressure-sensitive adhesive, an acrylic pressure-sensitive adhesive, a vinyl alkyl ether-based pressure-sensitive adhesive, a silicone-based pressure-sensitive adhesive, a polyester-based pressure-sensitive adhesive, a polyamide-based pressure-sensitive adhesive, a urethane-based pressure-sensitive adhesive, a fluorine-based pressure-sensitive adhesive, and a styrene-diene block copolymer-based pressure-sensitive adhesive. The pressure-sensitive adhesive may have blended therein, for example, a known or commonly used additive, such as a plasticizer, a filler, a surfactant, an age resistor, or a tackifier.

The thickness of the other pressure-sensitive adhesive layer is preferably 300 μm or less, more preferably from 1 μm to 300 μm, still more preferably from 5 μm to 100 μm.

E. Elastic Layer

The pressure-sensitive adhesive sheet of the present invention may further include an elastic layer. The elastic layer may be arranged on one surface of the pressure-sensitive adhesive layer. When the pressure-sensitive adhesive sheet includes the base material, the elastic layer may be arranged between the pressure-sensitive adhesive layer and the base material. When the pressure-sensitive adhesive sheet includes the elastic layer, its followability to an adherend is improved.

The elastic layer contains a base polymer, and as the base polymer, the polymers given as examples of the base polymer for forming the pressure-sensitive adhesive layer may each be used. In one embodiment, the elastic layer may contain a natural rubber, a synthetic rubber, a synthetic resin, or the like. Examples of the synthetic rubber and the synthetic resin include: a nitrile-based, diene-based, or acrylic synthetic rubber; a polyolefin-based or polyester-based thermoplastic elastomer; an ethylene-vinyl acetate copolymer; polyurethane; polybutadiene; and a soft polyvinyl chloride. The base polymer for forming the elastic layer may be identical to or different from the base polymer for forming the pressure-sensitive adhesive layer. The elastic layer may be a foamed film formed from the base polymer. The foamed film may be obtained by any appropriate method. The elastic layer and the pressure-sensitive adhesive layer may be distinguished from each other on the basis of a difference between their base polymers.

The elastic layer may contain any appropriate additive as required. Examples of the additive include a cross-linking agent, a vulcanizing agent, a tackifying resin, a plasticizer, a softener, a filler, and an age resistor. When a hard resin, such as polyvinyl chloride, is used as the base polymer, it is preferred that the plasticizer and/or the softener be used therewith to form an elastic layer having desired elasticity.

The thickness of the elastic layer is preferably from 3 μm to 200 μm, more preferably from 5 μm to 100 μm. When the thickness falls within such ranges, the above-mentioned function of the elastic layer can be sufficiently exhibited.

F. Separator

The pressure-sensitive adhesive sheet of the present invention may further include a separator as required. At least one surface of the separator is a release surface, and the separator may be arranged in order to protect the pressure-sensitive adhesive layer. The separator may be formed from any appropriate material.

G. Method of Manufacturing Pressure-sensitive Adhesive Sheet

The pressure-sensitive adhesive sheet of the present invention may be manufactured by any appropriate method. Examples of the method of manufacturing the pressure-sensitive adhesive sheet of the present invention include: a method involving directly applying a composition containing the pressure-sensitive adhesive onto the base material (any appropriate base when a pressure-sensitive adhesive sheet that does not include the base material is to be obtained); or a method involving transferring, onto the base material, an applied layer formed by applying a composition containing the pressure-sensitive adhesive onto any appropriate base. The composition containing the pressure-sensitive adhesive may contain any appropriate solvent.

When the pressure-sensitive adhesive sheet includes the elastic layer, the elastic layer may be formed by, for example, applying a composition for forming the elastic layer onto the base material or the pressure-sensitive adhesive layer.

Any appropriate application method may be adopted as an application method for each of the above-mentioned compositions. For example, each layer may be formed by application, followed by drying. Examples of the application method include application methods each using a multi-coater, a die coater, a gravure coater, an applicator, or the like. As a drying method, there are given, for example, natural drying and drying by heating. When the drying by heating is performed, a heating temperature may be set to any appropriate temperature depending on the characteristics of a substance to be dried.

EXAMPLES

Now, the present invention is specifically described by way of Examples. However, the present invention is by no means limited to these Examples. Evaluation methods in Examples are as described below. In the following evaluations, a pressure-sensitive adhesive sheet obtained by peeling a separator was used. In addition, the terms "part(s)" and "%" in Examples are by weight unless otherwise stated.

<Evaluation Methods>

In the following evaluation methods, the bonding of a pressure-sensitive adhesive layer (and another pressure-sensitive adhesive layer) was performed after a separator laminated on the bonding surface thereof had been peeled therefrom.

(1) Shear Adhesive Strength

A pressure-sensitive adhesive sheet (size: 20 mm×20 mm) obtained in each of Examples and Comparative Examples was fixed by bonding the surface thereof on the opposite side to the pressure-sensitive adhesive layer thereof to a predetermined base (e.g., 20 mm×20 mm silicon chip). A 5 mm×5 mm silicon chip was placed on the pressure-sensitive adhesive layer surface of the pressure-sensitive adhesive sheet, and the silicon chip was subjected to thermocompression bonding under the bonding conditions of 100° C. and 0.1 MPa for 1 minute with a heat pressing machine to produce an evaluation sample. A double-sided tape No. 585 manufactured by Nitto Denko Corporation was used to fix a pressure-sensitive adhesive sheet that did not include another pressure-sensitive adhesive layer to the base.

With use of the evaluation sample, under an ambient temperature of 25° C., Dage 4000 manufactured by Nordson Corporation was used to apply an external force in a horizontal direction to the chip at a shear rate of 500 µm/sec. with a measuring terminal being set on the side surface of the 5 mm×5 mm silicon chip at a position at a height of 50 µm from the bonded surface, and the maximum breaking load was read from the thus obtained load-displacement curve and was adopted as a shear adhesive strength under an ambient temperature of 25° C. In addition, under an ambient temperature of 80° C., a shear adhesive strength was measured in the same manner as described above.

Table 1 shows values each of which is an average of three measurements.

(2) Microhardness

A Berkovich (triangular pyramid-shaped) probe made of diamond was perpendicularly pressed against the pressure-sensitive adhesive layer surface of the pressure-sensitive adhesive sheet obtained in each of Examples and Comparative Examples, and the thus obtained displacement-load hysteresis curve was subjected to numerical processing with software (TriboScan) included with a measurement apparatus, to thereby measure a microhardness H. The microhardness H was measured with a nanoindenter (Triboindenter TI-950 manufactured by Hysitron, Inc.) by a single indentation method at 25° C. under the measurement conditions of an indentation speed of about 500 nm/sec and an indentation depth of about 3,000 nm.

In addition, a value calculated by the expression $1.9385 \times \log h_A + 4.2611$ was calculated from the microhardness H.

(3) Sapphire Grindability

A sapphire wafer having a thickness of 900 µm and a size of 4 inches was placed on the pressure-sensitive adhesive layer of the pressure-sensitive adhesive sheet obtained in each of Examples and Comparative Examples, and then the sapphire wafer and the pressure-sensitive adhesive sheet were compression-bonded to each other with a heat pressing machine, which had been preheated to 90° C. in advance, at a pressure of 1.0 MPa for 5 minutes. The pressure-sensitive adhesive sheet having the sapphire wafer fixed thereto was set in a grinder apparatus DFG8540 manufactured by DISCO Corporation, and the sapphire wafer was ground until the wafer thickness became 120 µm. Grindability was evaluated on the basis of the following criteria.

○: Back surface grinding can be performed until the wafer thickness becomes 120 µm.

×: The wafer is broken or an edge of the wafer is chipped before the wafer thickness becomes 120 µm. (Back surface grinding cannot be performed.)

(4) Peelability

An adherend SUS304BA after the evaluation of the peeling pressure-sensitive adhesive strength of the pressure-sensitive adhesive sheet at 80° C. in the following (5) was visually observed. Peelability was evaluated on the basis of the following criteria.

○: No residue of a pressure-sensitive adhesive that has undergone cohesive failure is present on the SUS304BA, and no bonding trace is present.

Δ: No residue of a pressure-sensitive adhesive that has undergone cohesive failure is present on the SUS304BA, but a bonding trace can be recognized.

×: A residue of a pressure-sensitive adhesive that has undergone cohesive failure can be recognized on the SUS304BA.

(5) Peeling Pressure-Sensitive Adhesive Strength at 80° C.

The pressure-sensitive adhesive sheet obtained in each of Examples and Comparative Examples was cut to have a width of 20 mm, and the pressure-sensitive adhesive surface (pressure-sensitive adhesive layer surface) of the pressure-sensitive adhesive sheet was bonded to SUS304BA with a hand roller to form a laminate. Then, the laminate was subjected to compression bonding at a pressure of 0.3 MPa for 1 minute with a heat pressing machine, which had been preheated to 80° C. in advance, to produce a sample. A pressure-sensitive adhesive strength was measured for the sample by peeling the pressure-sensitive adhesive sheet from the SUS304BA under the conditions of a peel angle of 180° and a peel rate of 300 mm/min.

When the pressure-sensitive adhesive sheet was a pressure-sensitive adhesive sheet that included no base material (Example 28), the peeling pressure-sensitive adhesive strength was measured as follows: a pressure-sensitive adhesive tape No. 315 manufactured by Nitto Denko Corporation was bonded to the surface of the pressure-sensitive adhesive sheet on the opposite side to the pressure-sensitive adhesive layer surface, and then the sample was produced.

(6) Tensile Modulus of Elasticity of Base Material

A base material (width: 10 mm) used for the pressure-sensitive adhesive sheet was used as a sample, and was measured for its tensile modulus of elasticity at 25° C. with a dynamic viscoelasticity-measuring apparatus (manufactured by TA Instruments, product name: "RSA-3"). The measurement was performed at a chuck-to-chuck distance of 20 mm, a measurement frequency of 1 Hz, an initial strain of 0.05%, and a rate of temperature increase of 5° C./min (from −20° C. to 100° C.).

[Production Example 1] Preparation of Resin Composition (I)

100 Parts by weight of a maleic acid-modified styrene-ethylene-butylene-styrene block copolymer (a) (SEBS: styrene moiety/ethylene-butylene moiety (weight ratio)=20/80, acid value: 10 (mg-CH$_3$ONa/g), manufactured by Asahi Kasei Chemicals Corporation, product name: "Tuftec M1943"), 20 parts by weight of a terpene phenol-based tackifying resin (manufactured by Yasuhara Chemical Co., Ltd., product name: "YS POLYSTER T80", softening point: 80° C.), 3 parts by weight of an epoxy-based cross-linking agent (manufactured by Mitsubishi Gas Chemical Company, Inc., product name: "TETRAD-C"), 3 parts by weight of a fatty acid ester-based surfactant (manufactured by Kao Corporation, product name: "EXCEPARL IPP", molecular weight: 298.5, carbon number of alkyl group: 16), and toluene serving as a solvent were mixed to prepare a resin composition (I) (mixture)

[Production Example 2-1] Preparation of Resin Composition (II-1)

100 Parts by weight of a maleic acid-modified styrene-ethylene-butylene-styrene block copolymer (b) (SEBS: styrene moiety/ethylene-butylene moiety (weight ratio)=30/70, acid value: 10 (mg-CH$_3$ONa/g), manufactured by Asahi Kasei Chemicals Corporation, product name: "Tuftec M1913"), 50 parts by weight of a terpene phenol-based tackifying resin (manufactured by Yasuhara Chemical Co., Ltd., product name: "YS POLYSTER T80"), 3 parts by weight of an epoxy-based cross-linking agent (manufactured by Mitsubishi Gas Chemical Company, Inc., product name: "TETRAD-C"), 3 parts by weight of a fatty acid ester-based surfactant (manufactured by Kao Corporation, product name: "EXCEPARL IPP", molecular weight: 298.5, carbon number of alkyl group: 16), and toluene serving as a solvent were mixed to prepare a resin composition (II-1) (mixture).

[Production Examples 2-2 to 2-10] Preparation of Resin Compositions (II-2 to II-10)

Resin compositions (II-2 to II-10) were prepared in the same manner as in Production Example 2-1 except that surfactants shown in Table 1 were used in addition amounts shown in Table 1 in place of 3 parts by weight of the fatty acid ester-based surfactant (manufactured by Kao Corporation, product name: "EXCEPARL IPP", molecular weight: 298.5, carbon number of alkyl group: 16). The surfactants used are as described below.

Production Example 2-2 (resin composition (II-2)): phosphoric acid ester-based surfactant; manufactured by Toho Chemical Industry Co., Ltd., product name: "PHOSPHANOL RL210", chemical formula: $C_{22}H_{47}O_5P$, carbon number of alkyl group: 18, molecular weight: 422.57

Production Example 2-3 (resin composition (II-3)): fatty acid amide-based surfactant; manufactured by Tokyo Chemical Industry Co., Ltd., stearamide, chemical formula: $C_{18}H_{37}NO$, carbon number of alkyl group: 18, molecular weight: 283.49

Production Example 2-4 (resin composition (II-4)): fatty acid amide-based surfactant; manufactured by Tokyo Chemical Industry Co., Ltd., lauramide, chemical formula: $C_{12}H_{25}NO$, carbon number of alkyl group: 12, molecular weight: 199.33

Production Example 2-5 (resin composition (II-5)): fatty acid aminoalkyl amide-based surfactant; manufactured by Toho Chemical Industry Co., Ltd., product name: "CATINAL MAPS", chemical formula: $C_{23}H_{38}N_2O$, carbon number of alkyl group: 18, molecular weight: 358.56

Production Example 2-6 (resin composition (II-6)): trimethylammonium chloride-based surfactant; manufactured by Toho Chemical Industry Co., Ltd., product name: "CATINAL STC-70ET", chemical formula: $C_{21}H_{46}ClN$, carbon number of alkyl group: 16, molecular weight: 348.04

Production Example 2-7 (resin composition (II-7)): dimethylbenzylammonium chloride-based surfactant; manufactured by Sanyo Chemical Industries, Ltd., product name: "CATION S", chemical formula: $C_{26}H_{48}ClN$, carbon number of alkyl group: 18, molecular weight: 410.11

Production Example 2-8 (resin composition (II-8)): succinic anhydride-based surfactant; manufactured by Sanyo Chemical Industries, Ltd., product name: "DSA", chemical formula: $C_{16}H_{26}O_3$, carbon number of alkyl group: 12, molecular weight: 266.37

Production Example 2-9 (resin composition (II-9)): succinic anhydride-based surfactant; manufactured by Sanyo Chemical Industries, Ltd., product name: "PDSA-DA", chemical formula: $C_{19}H_{32}O_3$, carbon number of alkyl group: 15, molecular weight: 308.45

Production Example 2-10 (resin composition (II-10)): sodium sulfosuccinate-based surfactant; manufactured by Sanyo Chemical Industries, Ltd., product name: "Sansepara 100", chemical formula: $C_{20}H_{27}O_7SNa$, carbon number of alkyl group: 6, molecular weight: 434.48

TABLE 1

|  | Production Example 2-1 | Production Example 2-2 | Production Example 2-3 | Production Example 2-4 | Production Example 2-5 |
| --- | --- | --- | --- | --- | --- |
| Resin composition No. | II-1 | II-2 | II-3 | II-4 | II-5 |
| Tackifying resin | Terpene phenol-based | Terpene phenol-based | Terpene phenol-based | Terpene phenol-based | Terpene phenol-based |

TABLE 1-continued

| | | | | | |
|---|---|---|---|---|---|
| Softening point (° C.) | 80 | 80 | 80 | 80 | 80 |
| Addition amount (part(s) by weight) | 50 | 50 | 50 | 50 | 50 |
| Kind of surfactant | Fatty acid ester-based | Phosphoric acid ester-based | Fatty acid amide-based | Fatty acid amide-based | Fatty acid aminoalkylamide-based |
| Carbon number of alkyl group | 16 | 18 | 18 | 12 | 18 |
| Molecular weight/formula weight | 298.5 | 422.57 | 283.49 | 199.33 | 358.56 |
| Addition amount (part(s) by weight) | 3 | 1 | 0.001 | 0.005 | 5 |

| | Production Example 2-6 | Production Example 2-7 | Production Example 2-8 | Production Example 2-9 | Production Example 2-10 |
|---|---|---|---|---|---|
| Resin composition No. | II-6 | II-7 | II-8 | II-9 | II-10 |
| Tackifying resin | Terpene phenol-based | Terpene phenol-based | Terpene phenol-based | Terpene phenol-based | Terpene phenol-based |
| Softening point (° C.) | 80 | 80 | 80 | 80 | 80 |
| Addition amount (part(s) by weight) | 50 | 50 | 50 | 50 | 50 |
| Kind of surfactant | Trimethylammonium chloride-based | Dimethylbenzyl ammonium chloride-based | Succinic anhydride-based | Succinic anhydride-based | Sodium sulfosuccinate-based |
| Carbon number of alkyl group | 16 | 18 | 12 | 15 | 6 |
| Molecular weight/formula weight | 348.04 | 410.11 | 266.37 | 308.45 | 434.48 |
| Addition amount (part(s) by weight) | 1 | 1 | 1 | 1 | 1 |

[Production Example 3] Preparation of Resin Composition (III)

A resin composition (III) was prepared in the same manner as in Production Example 2 except that a terpene phenol-based tackifying resin (manufactured by Yasuhara Chemical Co., Ltd., product name: "YS POLYSTER 5145", softening point: 145° C.) was used in place of the terpene phenol-based tackifying resin (manufactured by Yasuhara Chemical Co., Ltd., product name: "YS POLYSTER T80").

[Production Example 4] Preparation of Resin Composition (IV)

100 Parts by weight of a styrene-ethylene-butylene-styrene block copolymer (c) (acid unmodified product, manufactured by Asahi Kasei Chemicals Corporation, product name: "Tuftec H1043") 80 parts by weight of a terpene phenol-based tackifying resin (manufactured by Yasuhara Chemical Co., Ltd., product name: "YS POLYSTER T80"), 3 parts by weight of an epoxy-based cross-linking agent (manufactured by Mitsubishi Gas Chemical Company, Inc., product name: "TETRAD-C"), 3 parts by weight of a phosphoric acid ester-based surfactant (manufactured by Toho Chemical Industry Co., Ltd., product name: "PHOSPHANOL RL210", molecular weight: 422.57, carbon number of alkyl group: 18), and toluene serving as a solvent were mixed to prepare a resin composition (IV) (mixture).

[Production Example 5] Preparation of Resin Composition (V)

A resin composition (V) was prepared in the same manner as in Production Example 4 except that the addition amount of the terpene phenol-based tackifying resin (manufactured by Yasuhara Chemical Co., Ltd., product name: "YS POLYSTER T80") was changed to 20 parts by weight.

[Production Example 6] Preparation of Resin Composition (VI)

A resin composition (VI) was prepared in the same manner as in Production Example 2 except that the addition amount of the terpene phenol-based tackifying resin (manufactured by Yasuhara Chemical Co., Ltd., product name: "YS POLYSTER T80") was changed to 100 parts by weight.

[Production Example 7] Preparation of Resin Composition (VII)

A resin composition (VII) was prepared in the same manner as in Production Example 2 except that the addition amount of the terpene phenol-based tackifying resin (manufactured by Yasuhara Chemical Co., Ltd., product name: "YS POLYSTER T80") was changed to 125 parts by weight.

[Production Example 8] Preparation of Resin Composition (VIII)

A resin composition (VIII) was prepared in the same manner as in Production Example 2 except that the addition amount of the terpene phenol-based tackifying resin (manufactured by Yasuhara Chemical Co., Ltd., product name: "YS POLYSTER T80") was changed to 150 parts by weight.

[Production Example 9] Preparation of Resin Composition (IX)

A resin composition (IX) was prepared in the same manner as in Production Example 2 except that: the addition amount of the terpene phenol-based tackifying resin (manufactured by Yasuhara Chemical Co., Ltd., product name: "YS POLYSTER T80") was changed to 200 parts by weight; and 100 parts by weight of thermally expandable microspheres (manufactured by Matsumoto Yushi-Seiyaku Co., Ltd., product name: "Matsumoto Microsphere F-50D", foaming starting temperature: 120° C., average particle diameter: 14 μm) were further added.

Example 1

100 Parts by weight of an acrylic resin (butyl acrylate-acrylic acid copolymer, butyl acrylate:acrylic acid (weight ratio)=100:5), 3 parts by weight of an epoxy-based cross-linking agent (manufactured by Mitsubishi Gas Chemical Company, Inc., product name: "TETRAD-C"), 1 part by weight of a fatty acid ester-based surfactant (manufactured by Kao Corporation, product name: "EXCEPARL IPP", molecular weight: 298.5, carbon number of alkyl group: 16), and toluene serving as a solvent were mixed to prepare a resin composition (A). The resin composition (A) was applied onto a PET base material (thickness: 50 μm) so as to have a thickness of 3 μm after drying, and was dried to form a pressure-sensitive adhesive layer. Further, a separator was bonded onto the pressure-sensitive adhesive layer to produce a pressure-sensitive adhesive sheet having the layer configuration "PET base material/pressure-sensitive adhesive layer/separator". The resultant pressure-sensitive adhesive sheet was subjected to the evaluations (1) to (5). The results are shown in Table 2.

Example 2

The resin composition (I) prepared in Production Example 1 was applied onto a PET base material (thickness: 50 μm) so as to have a thickness of 15 μm after drying, and was dried to form a pressure-sensitive adhesive layer. Further, a separator was bonded onto the pressure-sensitive adhesive layer to produce a pressure-sensitive adhesive sheet having the layer configuration "PET base material/pressure-sensitive adhesive layer/separator". The resultant pressure-sensitive adhesive sheet was subjected to the evaluations (1) to (5). The results are shown in Table 2.

Example 3

A pressure-sensitive adhesive sheet was produced in the same manner as in Example 2 except that the thickness of the pressure-sensitive adhesive layer was changed to 20 μm. The resultant pressure-sensitive adhesive sheet was subjected to the evaluations (1) to (5). The results are shown in Table 2.

Example 4

A pressure-sensitive adhesive sheet was produced in the same manner as in Example 2 except that the thickness of the pressure-sensitive adhesive layer was changed to 25 μm. The resultant pressure-sensitive adhesive sheet was subjected to the evaluations (1) to (5). The results are shown in Table 2.

Examples 5 to 11

Pressure-sensitive adhesive sheets were produced in the same manner as in Example 2 except that: resin compositions shown in Table 2 (resin compositions (II-1) and (III) to (V) prepared in Production Example 2-1 and Production Examples 3 to 5) were used in place of the resin composition (I); and the thickness of the pressure-sensitive adhesive layer was changed to thicknesses shown in Table 2. The resultant pressure-sensitive adhesive sheets were subjected to the evaluations (1) to (5). The results are shown in Table 2.

TABLE 2

| | | | Example 1 | Example 2 | Example 3 | Example 4 | Example 5 | Example 6 |
|---|---|---|---|---|---|---|---|---|
| Pressure-sensitive adhesive layer | Composition | Resin composition No. | A | I | I | I | II-1 | II-1 |
| | | Base polymer | Acrylic | Maleic acid-modified SEBS | Maleic acid-modified SEBS | Maleic acid-modified SEBS | Maleic acid-modified SEBS | Maleic acid-modified SEBS |
| | | Styrene ratio | — | 20 | 20 | 20 | 30 | 30 |
| | | Tackifying resin | — | Terpene phenol-based | Terpene phenol-based | Terpene phenol-based | Terpene phenol-based | Terpene phenol-based |
| | | Softening point (° C.) | — | 80 | 80 | 80 | 80 | 80 |
| | | Addition amount (part(s) by weight) | — | 20 | 20 | 20 | 50 | 50 |
| | | Kind of surfactant | Fatty acid ester-based | Fatty acid ester-based | Fatty acid ester-based | Fatty acid ester-based | Fatty acid ester-based | Fatty acid ester-based |
| | | Carbon number of alkyl group | 16 | 16 | 16 | 16 | 16 | 16 |

TABLE 2-continued

|  |  |  |  |  |  |  |  |  |
|---|---|---|---|---|---|---|---|---|
|  |  | Molecular weight/formula weight |  | 298.5 | 298.5 | 298.5 | 298.5 | 298.5 | 298.5 |
|  |  | Addition amount (part(s) by weight) |  | 1 | 3 | 3 | 3 | 3 | 3 |
|  | Microhardness logH | (Pa) | 5.69 | 7.01 | 7.01 | 7.01 | 7.78 | 7.78 |
|  | Thickness $h_A$ | (μm) | 3 | 15 | 20 | 25 | 30 | 50 |
|  | Thickness $\log h_A$ | (μm) | 0.48 | 1.18 | 1.30 | 1.40 | 1.48 | 1.70 |
|  | $1.9385 \times \log h_A + 4.2611$ |  | 5.19 | 5.54 | 6.78 | 6.97 | 7.12 | 7.55 |
| Base material | Material |  | PET | PET | PET | PET | PET | PET |
|  | Tensile modulus of elasticity | (MPa) | 3,802 | 3,802 | 3,802 | 3,802 | 3,802 | 3,802 |
|  | Thickness | (μm) | 50 | 50 | 50 | 50 | 50 | 50 |
|  | Total thickness | (μm) | 53 | 65 | 70 | 75 | 80 | 100 |
| Evaluation | Shear adhesive strength | (MPa) | 4.63 | 4.85 | 4.96 | 5.01 | 5.64 | 4.69 |
|  | Sapphire grindability |  | ◯ | ◯ | ◯ | ◯ | ◯ | ◯ |
|  | Peelability |  | ◯ | ◯ | ◯ | ◯ | ◯ | ◯ |
|  | Pressure-sensitive adhesive strength at 80° C. | (N/20 mm) | 0.19 | 0.25 | 0.25 | 0.22 | 1.41 | 0.89 |

|  |  |  |  | Example 7 | Example 8 | Example 9 | Example 10 | Example 11 |
|---|---|---|---|---|---|---|---|---|
| Pressure-sensitive adhesive layer | Composition | Resin composition No. |  | II-1 | III | III | IV | V |
|  |  | Base polymer |  | Maleic acid-modified SEBS | Maleic acid-modified SEBS | Maleic acid-modified SEBS | SEBS | SEBS |
|  |  | Styrene ratio |  | 30 | 30 | 30 | 70 | 70 |
|  |  | Tackifying resin |  | Terpene phenol-based | Terpene phenol-based | Terpene phenol-based | Terpene phenol-based | Terpene phenol-based |
|  |  | Softening point | (° C.) | 80 | 145 | 145 | 80 | 80 |
|  |  | Addition amount (part(s) by weight) |  | 50 | 50 | 50 | 80 | 20 |
|  |  | Kind of surfactant |  | Fatty acid ester-based | Fatty acid ester-based | Fatty acid ester-based | Phosphoric acid ester-based | Phosphoric acid ester-based |
|  |  | Carbon number of alkyl group |  | 16 | 16 | 16 | 18 | 18 |
|  |  | Molecular weight/formula weight |  | 298.5 | 298.5 | 298.5 | 422.57 | 422.57 |
|  |  | Addition amount (part(s) by weight) |  | 3 | 3 | 3 | 3 | 3 |
|  | Microhardness logH | (Pa) |  | 7.78 | 8.57 | 8.57 | 8.81 | 8.45 |
|  | Thickness $h_A$ | (μm) |  | 60 | 50 | 150 | 10 | 10 |
|  | Thickness $\log h_A$ | (μm) |  | 1.78 | 1.70 | 2.18 | 1.00 | 1.00 |
|  | $1.9385 \times \log h_A + 4.2611$ |  |  | 7.71 | 7.55 | 8.48 | 6.20 | 6.20 |
| Base material | Material |  |  | PET | PET | PET | PET | PET |
|  | Tensile modulus of elasticity | (MPa) |  | 3,802 | 3,802 | 3,802 | 3,802 | 3,802 |
|  | Thickness | (μm) |  | 50 | 50 | 50 | 50 | 50 |
|  | Total thickness | (μm) |  | 110 | 100 | 200 | 60 | 60 |
| Evaluation | Shear adhesive strength | (MPa) |  | 6.40 | 6.58 | 5.34 | 1.98 | 1.51 |
|  | Sapphire grindability |  |  | ◯ | ◯ | ◯ | ◯ | ◯ |
|  | Peelability |  |  | ◯ | ◯ | Δ | Δ | Δ |
|  | Pressure-sensitive adhesive strength at 80° C. | (N/20 mm) |  | 2.03 | 10.18 | 19.33 | 0.19 | 0.10 |

Example 12

100 Parts by weight of an ethylene-vinyl acetate copolymer resin (manufactured by Mitsubishi Chemical Company, Inc., product name: "EV-40 W"), 3 parts by weight of an epoxy-based cross-linking agent (manufactured by Mitsubishi Gas Chemical Company, Inc., product name: "TET-RAD-C"), 3 parts by weight of a fatty acid ester-based surfactant (manufactured by Kao Corporation, product name: "EXCEPARL IPP", molecular weight: 298.5, carbon number of alkyl group: 16), and toluene serving as a solvent were mixed to prepare a resin composition (B). The resin composition (B) was applied onto a PET base material (thickness: 50 μm) so as to have a thickness of 15 μm after drying, and was dried to form a pressure-sensitive adhesive layer. Further, a separator was bonded onto the pressure-sensitive adhesive layer to produce a pressure-sensitive adhesive sheet having the layer configuration "PET base material/pressure-sensitive adhesive layer/separator". The resultant pressure-sensitive adhesive sheet was subjected to the evaluations (1) to (5). The results are shown in Table 3.

Example 13

A pressure-sensitive adhesive sheet was obtained in the same manner as in Example 12 except that an ethylene-vinyl acetate copolymer resin (manufactured by Mitsubishi Chemical Corporation, product name: "EV-150") was used in place of the ethylene-vinyl acetate copolymer resin (manufactured by Mitsubishi Chemical Corporation, product name: "EV-40 W"). The resultant pressure-sensitive adhesive sheet was subjected to the evaluations (1) to (5). The results are shown in Table 3.

Examples 14 to 25

Pressure-sensitive adhesive sheets were produced in the same manner as in Example 2 except that: resin compositions shown in Table 2 (resin compositions (VI) to (VIII) and (II-2) to (II-11)) were used in place of the resin composition (I); and the thickness of the pressure-sensitive adhesive layer was changed to thicknesses shown in Table 2. The resultant pressure-sensitive adhesive sheets were subjected to the evaluations (1) to (5). The results are shown in Table 3.

TABLE 3

| | | | Example 12 | Example 13 | Example 14 | Example 15 | Example 16 | Example 17 | Example 18 |
|---|---|---|---|---|---|---|---|---|---|
| Pressure-sensitive adhesive layer | Composition | Resin composition No. | B | B | VI | VII | VIII | II 2 | II 3 |
| | | Base polymer | EVA | EVA | Maleic acid-modified SEBS | Maleic acid-modified SEBS | Maleic acid-modified SEBS | Maleic acid-modified SEBS | Maleic acid-modified SEBS |
| | | Styrene ratio | — | — | 30 | 30 | 30 | 30 | 30 |
| | | Tackifying resin | — | — | Terpene phenol-based | Terpene phenol-based | Terpene phenol-based | Terpene phenol-based | Terpene phenol-based |
| | | Softening point (° C.) | — | — | 80 | 80 | 80 | 80 | 80 |
| | | Addition amount (part(s) by weight) | — | — | 100 | 125 | 150 | 50 | 50 |
| | | Kind of surfactant | Fatty acid ester-based | Fatty acid ester-based | Fatty acid ester-based | Fatty acid ester-based | Fatty acid ester-based | Phosphoric acid ester-based | Fatty acid ester-based |
| | | Carbon number of alkyl group | 16 | 16 | 16 | 16 | 16 | 18 | 18 |
| | | Molecular weight/formula weight | 298.5 | 298.5 | 298.5 | 298.5 | 298.5 | 422.57 | 283.49 |
| | | Addition amount (part(s) by weight) | 1 | 1 | 3 | 3 | 3 | 1 | 0.001 |
| | Microhardness logH | (Pa) | 6.51 | 7.04 | 8.12 | 8.25 | 8.27 | 7.78 | 7.78 |
| | Thickness $h_A$ | (μm) | 15 | 25 | 30 | 30 | 30 | 20 | 20 |
| | Thickness $\log h_A$ | | 1.18 | 1.40 | 1.48 | 1.48 | 1.48 | 1.30 | 1.30 |
| | $1.9385 \times \log h_A + 4.2611$ | | 6.54 | 6.97 | 7.12 | 7.12 | 7.12 | 6.78 | 6.78 |
| Base material | Material | | PET | PET | PET | PET | PET | PET | PET |
| | Tensile modulus of elasticity | (MPa) | 3,802 | 3,802 | 3,802 | 3,802 | 3,802 | 3,802 | 3,802 |
| | Thickness | (μm) | 50 | 50 | 50 | 50 | 50 | 50 | 50 |
| Total thickness | | (μm) | 65 | 75 | 80 | 80 | 80 | 70 | 70 |
| Evaluation | Shear adhesive strength | (MPa) | 3.41 | 3.57 | 6.96 | 6.26 | 6.06 | 4.23 | 4.84 |
| | Sapphire grindability | | ○ | ○ | ○ | ○ | ○ | ○ | ○ |
| | Peelability | | Δ | Δ | ○ | ○ | Δ | ○ | ○ |
| | Pressure-sensitive adhesive strength at 80° C. | (N/20 mm) | 0.09 | 1.86 | 6.19 | 6.04 | 11.22 | 1.03 | 2.41 |

TABLE 3-continued

| | | | Example 19 | Example 20 | Example 21 | Example 22 | Example 23 | Example 24 | Example 25 |
|---|---|---|---|---|---|---|---|---|---|
| Pressure-sensitive adhesive layer | Composition | Resin composition No. | II-4 | II-5 | II-6 | II-7 | II-8 | II-9 | II-10 |
| | | Base polymer | Maleic acid-modified SEBS | Maleic acid-modified SEBS | Maleic acid-modified SEBS | Maleic acid-modified SEBS | Maleic acid-modified SEBS | Maleic acid-modified SEBS | Maleic acid-modified SEBS |
| | | Styrene ratio | 30 | 30 | 30 | 30 | 30 | 30 | 30 |
| | | Tackifying resin | Terpene phenol-based | Terpene phenol-based | Terpene phenol-based | Terpene phenol-based | Terpene phenol-based | Terpene phenol-based | Terpene phenol-based |
| | | Softening point (° C.) | 80 | 80 | 80 | 80 | 80 | 80 | 80 |
| | | Addition amount (part(s) by weight) | 50 | 50 | 50 | 50 | 50 | 50 | 50 |
| | | Kind of surfactant | Fatty acid amide-based | Fatty acid aminoalkylamide-based | Trimethylammonium chloride-based | Dimethylbenzylammonium chloride-based | Succinic anhydride-based | Succinic anhydride-based | Sodium sulfo-succinate-based |
| | | Carbon number of alkyl group | 12 | 18 | 16 | 18 | 12 | 15 | 6 |
| | | Molecular weight/formula weight | 199.33 | 358.56 | 348.04 | 410.11 | 266.37 | 308.45 | 434.48 |
| | | Addition amount (part(s) by weight) | 0.005 | 5 | 1 | 1 | 1 | 1 | 1 |
| | Micro-hardness $\log H$ | (Pa) | 7.78 | 7.78 | 7.78 | 7.78 | 7.78 | 7.78 | 7.78 |
| | Thickness $h_A$ | (μm) | 20 | 20 | 20 | 20 | 20 | 20 | 20 |
| | Thickness $\log h_A$ | | 1.30 | 1.30 | 1.30 | 1.30 | 1.30 | 1.30 | 1.30 |
| | $1.9385 \times \log h_A + 4.2611$ | | 6.78 | 6.78 | 6.78 | 6.78 | 6.78 | 6.78 | 6.78 |
| Base material | Material | | PET | PET | PET | PET | PET | PET | PET |
| | Tensile modulus of elasticity | (MPa) | 3,802 | 3,802 | 3,802 | 3,802 | 3,802 | 3,802 | 3,802 |
| | Thickness | (μm) | 50 | 50 | 50 | 50 | 50 | 50 | 50 |
| Total thickness | | (μm) | 70 | 70 | 70 | 70 | 70 | 70 | 70 |
| Evaluation | Shear adhesive strength | (MPa) | 5.97 | 5.23 | 5.95 | 5.00 | 5.66 | 5.91 | 6.06 |
| | Sapphire grindability | | ○ | ○ | ○ | ○ | ○ | ○ | ○ |
| | Peelability | | ○ | ○ | ○ | ○ | ○ | ○ | ○ |
| | Pressure-sensitive adhesive strength at 80° C. | (N/20 mm) | 4.38 | 2.32 | 3.24 | 1.62 | 4.08 | 3.73 | 3.66 |

Example 26

A pressure-sensitive adhesive sheet was obtained in the same manner as in Example 5 except that: a polyolefin-based base material (thickness: 80 μm) was used in place of the PET base material (thickness: 50 μm); and the thickness of the pressure-sensitive adhesive layer was changed to 20 μm. The resultant pressure-sensitive adhesive sheet was subjected to the evaluations. The results are shown in Table 4.

A base material obtained as follows was used as the polyolefin-based base material: a propylene-based thermoplastic elastomer containing a propylene component and an ethylene propylene rubber component (manufactured by Mitsubishi Chemical Corporation, product name: "ZELAS") was fed to a T-die molding machine manufactured by Placo Co., Ltd. (preset temperature: 230° C.), and was formed into the shape of a film having a thickness of 80 μm.

Example 27

A pressure-sensitive adhesive sheet was obtained in the same manner as in Example 5 except that: a polyolefin-based base material (manufactured by Okura Industrial Co., Ltd., product name "NSO #60", thickness: 60 μm) was used in place of the PET base material (thickness: 50 μm); and the thickness of the pressure-sensitive adhesive layer was changed to 20 μm. The resultant pressure-sensitive adhesive sheet was subjected to the evaluations. The results are shown in Table 4.

Example 28

The resin composition (IX) prepared in Production Example 9 was applied onto a separator so as to have a thickness of 40 μm after drying, and was dried to form a pressure-sensitive adhesive layer. Further, the pressure-sensitive adhesive layer on the separator was bonded to another separator to produce a pressure-sensitive adhesive sheet having the layer configuration "separator/pressure-sensitive adhesive layer/separator". The resultant pressure-sensitive adhesive sheet was subjected to the evaluations (1) to (5). The results are shown in Table 4.

TABLE 4

| | | | Example 1 | Example 2 | Example 3 |
|---|---|---|---|---|---|
| Pressure-sensitive adhesive layer | Composition | Resin composition No. | II-1 | II-1 | IX |
| | | Base polymer | Maleic acid-modified SEBS | Maleic acid-modified SEBS | Maleic acid-modified SEBS |
| | | Styrene ratio | 30 | 30 | 30 |
| | | Tackifying resin | Terpene phenol-based | Terpene phenol-based | Terpene phenol-based |
| | | Softening point (° C.) | 80 | 80 | 80 |
| | | Addition amount (part(s) by weight) | 50 | 50 | 200 |
| | | Kind of surfactant | Fatty acid ester-based | Fatty acid ester-based | Fatty acid ester-based |
| | | Carbon number of alkyl group | 16 | 16 | 16 |
| | | Molecular weight/formula weight | 298.5 | 298.5 | 298.5 |
| | | Addition amount (part(s) by weight) | 3 | 3 | 3 |
| | | Addition amount of foaming agent (parts by weight) | — | — | 100 |
| | Microhardness $\log H$ | (Pa) | 7.78 | 7.78 | 7.78 |
| | Thickness $h_A$ | (μm) | 20 | 20 | 40 |
| | Thickness $\log h_A$ | (μm) | 1.30 | 1.30 | 1.60 |
| | $1.9385 \times \log h_A + 4.2611$ | | 6.78 | 6.78 | 7.37 |
| Base material | Material | | PO | PO | — |
| | Tensile modulus of elasticity | (MPa) | 52 | 71 | — |
| | Thickness | (μm) | 80 | 60 | — |
| | Total thickness | (μm) | 100 | 80 | 40 |
| Evaluation | Shear adhesive strength | (MPa) | 1.23 | 1.34 | 6.32 |
| | Sapphire grindability | | ○ | ○ | ○ |
| | Peelability | | ○ | ○ | ○ |
| | Pressure-sensitive adhesive strength at 80° C. | (N/20 mm) | 3.11 | 1.15 | 4.15 |

Comparative Example 1

A pressure-sensitive adhesive sheet was obtained in the same manner as in Example 2 except that the thickness of the pressure-sensitive adhesive layer was changed to 30 μm. The resultant pressure-sensitive adhesive sheet was subjected to the evaluations (1) to (5). The results are shown in Table 5.

Comparative Example 2

A pressure-sensitive adhesive sheet was obtained in the same manner as in Example 5 except that the thickness of the pressure-sensitive adhesive layer was changed to 70 μm. The resultant pressure-sensitive adhesive sheet was subjected to the evaluations (1) to (5). The results are shown in Table 5.

Comparative Example 3

A pressure-sensitive adhesive sheet was obtained in the same manner as in Example 8 except that the thickness of the pressure-sensitive adhesive layer was changed to 200 μm. The resultant pressure-sensitive adhesive sheet was subjected to the evaluations (1) to (5). The results are shown in Table 5.

Comparative Example 4

A pressure-sensitive adhesive sheet was obtained in the same manner as in Example 1 except that: an aromatic ester-based surfactant (manufactured by DIC Corporation, product name: "Monocizer W-700", molecular weight: 546.78, carbon number of alkyl group: 6) was used in place of 3 parts by weight of the fatty acid ester-based surfactant (manufactured by Kao Corporation, product name: "EXCEPARL IPP", molecular weight: 298.5, carbon number of alkyl group: 16); and the thickness of the pressure-sensitive adhesive layer was changed to 10 μm. The resultant pressure-sensitive adhesive sheet was subjected to the evaluations (1) to (5). The results are shown in Table 5.

TABLE 5

| | | | Comparative Example 1 | Comparative Example 2 | Comparative Example 3 | Comparative Example 4 |
|---|---|---|---|---|---|---|
| Pressure-sensitive adhesive layer | Composition | Resin composition No. | I | II-1 | III | A |
| | | Base polymer | SEBS | SEBS | Maleic acid-modified SEBS | Acrylic |
| | | Styrene ratio | 20 | 30 | 30 | — |
| | | Tackifying resin | Terpene phenol-based | Terpene phenol-based | Terpene phenol-based | — |
| | | Softening point (° C.) | 90 | 90 | 145 | — |
| | | Addition amount (part(s) by weight) | 20 | 50 | 50 | — |
| | | Kind of surfactant | Fatty acid ester-based | Fatty acid ester-based | Fatty acid ester-based | Aromatic ester-based |
| | | Carbon number of alkyl group | 16 | 16 | 16 | 6 |
| | | Molecular weight/formula weight | 298.5 | 298.5 | 298.5 | 546.78 |
| | | Addition amount (part(s) by weight) | 3 | 3 | 3 | 15 |
| | Microhardness log H | (Pa) | 7.01 | 7.78 | 8.57 | 5.69 |
| | Thickness $h_A$ | (μm) | 30 | 70 | 200 | 10 |
| | Thickness $\log h_A$ | (μm) | 1.48 | 1.85 | 2.30 | 1.00 |
| | 1.9385 × $\log h_A$ + 4.2611 | | 7.12 | 7.84 | 8.72 | 6.20 |
| Base material | Material | | PET | PET | PET | PET |
| | Tensile modulus of elasticity | (MPa) | 3,802 | 3,802 | 3,802 | 3,802 |
| | Thickness | (μm) | 50 | 50 | 50 | 100 |
| Total thickness | | (μm) | 90 | 120 | 250 | 110 |
| Evaluation | Shear adhesive strength | (MPa) | 3.49 | 4.18 | 5.70 | 0.98 |
| | Sapphire grindability | | x | x | x | x |
| | Peelability | | ○ | ○ | x | ○ |
| | Pressure-sensitive adhesive strength at 80° C. | (N/20 mm) | 0.20 | 2.08 | 21.41 | 0.05 |

REFERENCE SIGNS LIST 10 pressure-sensitive adhesive layer
20 base material
30 another pressure-sensitive adhesive layer
100, 200, 300 pressure-sensitive adhesive sheet

The invention claimed is:

1. A pressure-sensitive adhesive sheet, comprising a pressure-sensitive adhesive layer,
    wherein the pressure-sensitive adhesive layer is formed from a pressure-sensitive adhesive containing surfactant,
    wherein the pressure-sensitive adhesive layer has a thickness of from 1 m to 300 μm, and
    wherein a microhardness H (Pa) of the pressure-sensitive adhesive layer at 25° C. and the thickness, which is represented by $h_A$ (μm), of the pressure-sensitive adhesive layer satisfy a relationship represented by the following expression (1)

$$\log H \geq 1.9385 \times \log h_A + 4.2611 \tag{1}$$

wherein the microhardness H of the pressure-sensitive adhesive layer at 25° C. is 12 MPa to 1 GPa.

2. The pressure-sensitive adhesive sheet according to claim 1, wherein the pressure-sensitive adhesive sheet has a shear adhesive strength of 1.0 MPa or more under an ambient temperature of 25° C., when a pressure-sensitive adhesive surface thereof is bonded to a silicon chip.

3. The pressure-sensitive adhesive sheet according to claim 1, wherein the pressure-sensitive adhesive sheet has a peeling pressure-sensitive adhesive strength of 15 N/20 mm or less under an ambient temperature of 80° C. at a peel angle of 180° and a peel rate of 300 mm/min, when a pressure-sensitive adhesive surface thereof is bonded to SUS304BA.

4. The pressure-sensitive adhesive sheet according to claim 1,
wherein the pressure-sensitive adhesive further contains a base polymer, and
wherein the base polymer is a thermoplastic elastomer.

5. The pressure-sensitive adhesive sheet according to claim 4, wherein the thermoplastic elastomer is a styrene-based elastomer or an ethylene-vinyl acetate-based elastomer.

6. The pressure-sensitive adhesive sheet according to claim 4, wherein the pressure-sensitive adhesive further contains a tackifying resin.

7. The pressure-sensitive adhesive sheet according to claim 6, wherein a content of the tackifying resin is from 1 part by weight to 350 parts by weight with respect to 100 parts by weight of the base polymer.

8. The pressure-sensitive adhesive sheet according to claim 1, further comprising a base material arranged on at least one side of the pressure-sensitive adhesive layer.

9. The pressure-sensitive adhesive sheet according to claim 1, further comprising another pressure-sensitive adhesive layer arranged on at least one side of the pressure-sensitive adhesive layer.

10. The pressure-sensitive adhesive sheet according to claim 8, wherein the base material has a tensile modulus of elasticity of from $1 \times 10^7$ Pa to $1 \times 10^{10}$ Pa at 25° C.

11. The pressure-sensitive adhesive sheet according to claim 1, wherein the pressure-sensitive adhesive sheet is for use as a temporary fixing material during substrate processing in a semiconductor manufacturing process.

12. A method of grinding a substrate, comprising placing and fixing a substrate onto the pressure-sensitive adhesive layer of the pressure sensitive adhesive sheet according to claim 1, and then grinding a surface of the substrate on an opposite side to a pressure-sensitive adhesive layer side.

13. A method of manufacturing a chip, comprising a grinding step including placing and fixing a substrate onto the pressure-sensitive adhesive layer of the pressure sensitive adhesive sheet according to claim 1, and then grinding a surface of the substrate on an opposite side to a pressure-sensitive adhesive layer side.

14. The pressure-sensitive adhesive sheet according to claim 1, wherein the surfactant is selected from the group consisting of acid ester-based surfactant, fatty acid amide-based surfactant, fatty acid aminoalkylamide-based surfactant, trimethylammonium chloride-based surfactant, dimethylbenzylammonium chloride-based surfactant, succinic anhydride-based surfactant, and sodium sulfosuccinate-based surfactants.

15. The pressure-sensitive adhesive sheet according to claim 4, wherein a content of the surfactant is from 0.001 part by weight to 15 parts by weight with respect to 100 parts by weight of the base polymer.

* * * * *

UNITED STATES PATENT AND TRADEMARK OFFICE
CERTIFICATE OF CORRECTION

PATENT NO. : 12,122,947 B2
APPLICATION NO. : 17/269592
DATED : October 22, 2024
INVENTOR(S) : Shusaku Ueno, Takumi Yutou and Takamasa Hirayama Page 1 of 1

It is certified that error appears in the above-identified patent and that said Letters Patent is hereby corrected as shown below:

In the Claims

Column 35, Line 67: In Claim 1, please delete "1 m" and replace with --1 μm--

Signed and Sealed this
Thirty-first Day of December, 2024

Derrick Brent
*Acting Director of the United States Patent and Trademark Office*